US008425808B2

(12) United States Patent
Wu et al.

(10) Patent No.: US 8,425,808 B2
(45) Date of Patent: Apr. 23, 2013

(54) SEMICONDUCTING COMPOSITION

(75) Inventors: Yiliang Wu, Oakville (CA); Ping Liu, Mississauga (CA); Anthony James Wigglesworth, Oakville (CA); Nan-Xing Hu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 153 days.

(21) Appl. No.: 12/767,992

(22) Filed: Apr. 27, 2010

(65) Prior Publication Data

US 2011/0260114 A1 Oct. 27, 2011

(51) Int. Cl.
*H01B 1/12* (2006.01)

(52) U.S. Cl.
USPC .................. 252/519.4; 252/500; 252/519.34; 252/519.21; 252/519.31; 252/519.14; 252/521.6; 257/40

(58) Field of Classification Search .................. 252/500, 252/519.4, 519.34, 519.21, 519.31, 519.14, 252/521.6; 257/40
See application file for complete search history.

(56) References Cited

U.S. PATENT DOCUMENTS

| | | | | |
|---|---|---|---|---|
| 5,885,498 | A * | 3/1999 | Matsuo et al. | 252/583 |
| 5,965,063 | A * | 10/1999 | Agata et al. | 252/500 |
| 6,690,029 | B1 | 2/2004 | Anthony et al. | |
| 6,774,393 | B2 | 8/2004 | Murti et al. | |
| 7,372,071 | B2 | 5/2008 | Li et al. | |
| 7,425,723 | B2 | 9/2008 | Ong et al. | |
| 2007/0146426 | A1 | 6/2007 | Nelson et al. | |
| 2010/0108954 | A1* | 5/2010 | Benson-Smith et al. | 252/519.21 |
| 2011/0006295 | A1* | 1/2011 | Kathirgamanathan et al. | 257/40 |
| 2011/0132439 | A1* | 6/2011 | Jen et al. | 136/252 |

FOREIGN PATENT DOCUMENTS

JP 2007246579 A * 9/2007

OTHER PUBLICATIONS

CAS reg. No. 1345201-12-8, Nov. 15, 2011.*
CAS reg. No. 15546-43-7, Nov. 16, 1984.*
English Translation of JP 2007/246579, Sep. 2007.*
Chang, Seung Wook et al.: Sub-50 nm feature sizes using positive tone molecular glass resists for EUV lithography. In: J. Mater. Chem., 2006, 16, 1470-1474.
De Silva, Anuja et al.: Molecular Glass Resists for EUV Lithography. In: Proc. of SPIE vol. 6153, 615341-1 bis 10, (2006).
Getautis, Vytautas et al.: Influence of the hyroxyl groups on the properties of hydrazone based molecular glasses. In: Thin Solid Films 516 (2008) 8979-8983.
Schmidt, Rudiger et al.: Highly soluble acenes as semiconductors for thin film transistors. In: J. Mater. Chem., 2006, 16, 3708-3714.
Sonntag, Martin et al.: Novel star-shaped triphenylamine-based molecular glasses and their use in OFETs. In: Chemistry of materials, vol. 17, 2005, p. 3031-3039—ISSN 0897-4756.
Tanaka, Shinji et al.: Adamantane-based molecular glass resist for 193-nm lithography. In: Proc. of SPIE vol. 7273, 72732M1-M8, 2009.
German Search Report dated Mar. 21, 2012 for German Application No. 10 2011 007 727.8.

* cited by examiner

*Primary Examiner* — Douglas McGinty
(74) *Attorney, Agent, or Firm* — Fay Sharpe LLP

(57) ABSTRACT

The present application discloses, in various embodiments, semiconducting layer compositions comprising a non-amorphous semiconductor material and a molecular glass. Electronic devices, such as thin-film transistors, are also disclosed. The semiconducting layer compositions exhibit good film-forming properties and high mobility.

9 Claims, 2 Drawing Sheets

SEMICONDUCTING COMPOSITION

BACKGROUND

The present disclosure relates to semiconducting compositions for making semiconducting layers useful in electronic devices, such as thin film transistors (TFTs). Among other advantages, the semiconducting layers exhibit high field effect mobility and good film-forming properties.

Thin film transistors (TFTs) are critical components in modern-age electronics, including, for example, sensors, image scanners, and electronic display devices. TFT circuits using current mainstream silicon technology are too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. It is generally desired to make TFTs which have not only much lower manufacturing costs, but also appealing mechanical properties such as being physically compact, lightweight, and flexible.

TFTs are generally composed of, on a substrate, an electrically conductive gate electrode, source and drain electrodes, an electrically insulating gate dielectric layer which separates the gate electrode from the source and drain electrodes, and a semiconducting layer which is in contact with the gate dielectric layer and bridges the source and drain electrodes.

Printed organic thin-film transistors (OTFTs) show promise in applications such as RFID tags and LCD displays. Performance of OTFTs can be measured by mobility. The mobility is measured in units of $cm^2/V \cdot sec$; higher mobility is desired. Semiconducting compositions may generally be divided into two classes: small molecules and polymers. Small molecules show high mobility but poor film-forming properties when solution processed. Polymers have good film-forming properties but generally low mobility.

It would be desirable to develop a semiconducting composition that exhibits high field effect mobility and good film-forming properties.

BRIEF DESCRIPTION

The present application discloses, in various embodiments, semiconducting compositions comprising a non-amorphous semiconductor material and a molecular glass. Electronic devices, such as thin film transistors, incorporating the semiconducting compositions are also disclosed. The semiconducting compositions exhibit good film-forming properties and high mobility.

Disclosed in certain embodiments is a semiconducting composition comprising a non-amorphous semiconductor material and a molecular glass. The molecular glass may have a linear, T-type, tripodal, tetrahedral, or hyperbranched structure.

The molecular glass may comprise a spiro compound of Formula (1) or Formula (2):

Formula (1)

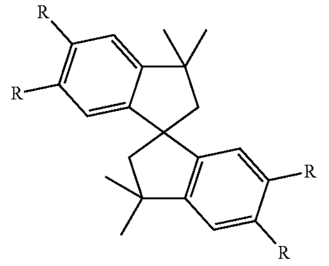

Formula (2)

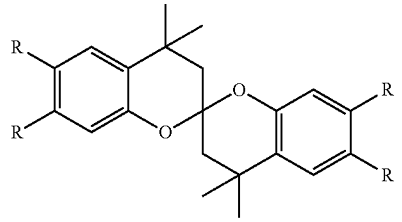

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; and R' is alkyl.

In some embodiments, the molecular glass is a structure selected from one of Formula (3) to Formula (8):

Formula (3)

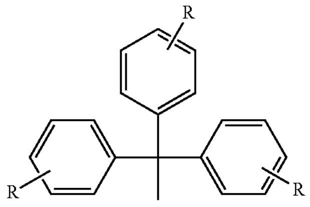

Formula (4)

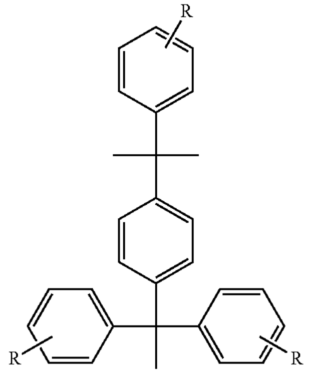

-continued

Formula (5)

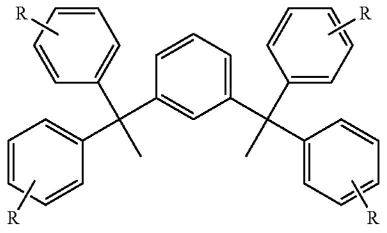

Formula (6)

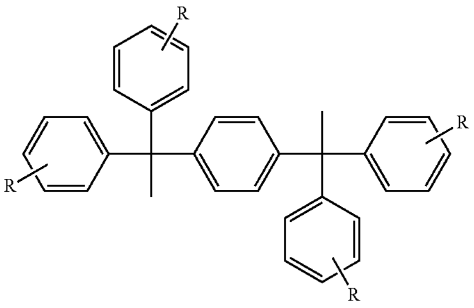

Formula (7)

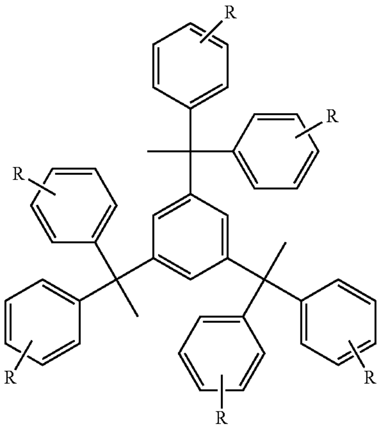

Formula (8)

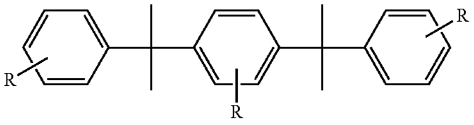

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; and R' is alkyl.

In other embodiments, the molecular glass is a silane of Formula (9):

Formula (9)

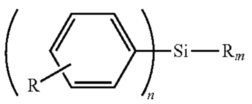

wherein each R is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; R' is alkyl; and m and n are both integers, wherein m+n=4.

In specific embodiments, the silane is of Formula (9a):

Formula (9a)

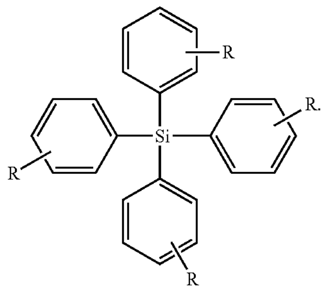

In still other embodiments, the molecular glass is an adamantane derivative of Formula (10):

Formula (10)

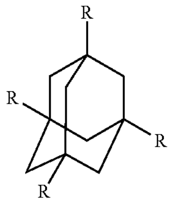

wherein each R is independently a substituent comprising a heteroatom.

In further embodiments, the molecular glass is a structure selected from one of Formula (11) to Formula (13):

Formula (11)

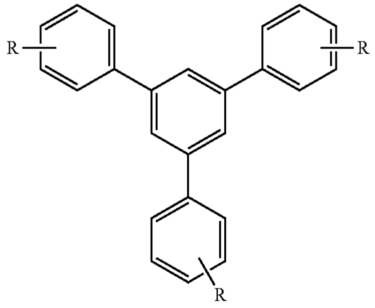

-continued

Formula (12)

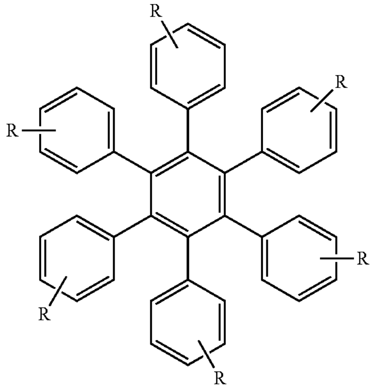

Formula (13)

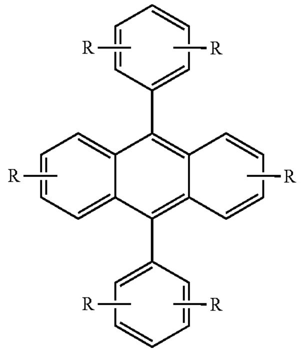

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; and R' is alkyl.

In further embodiments, the molecular glass is a calixarene derivative of Formula (14):

Formula (14)

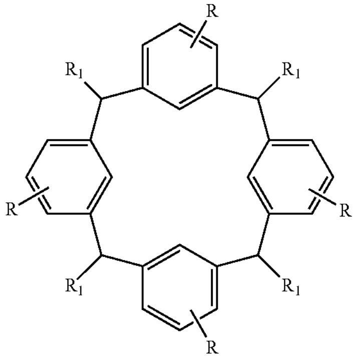

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; R' is alkyl; and $R_1$ is a phenyl group substituted with an oxygen-containing radical.

In still further embodiments, the molecular glass is an arylamine derivative selected from one of Formula (15) to Formula (24):

Formula (15)

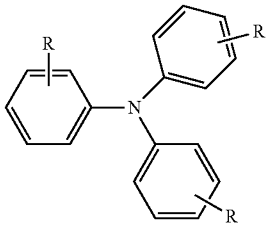

Formula (16)

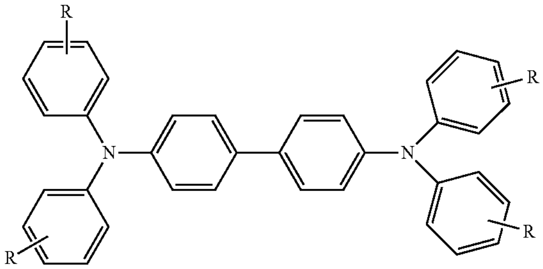

Formula (17)

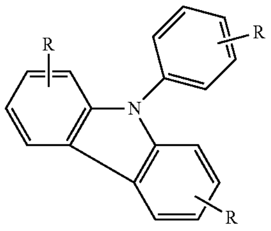

-continued
Formula (18)
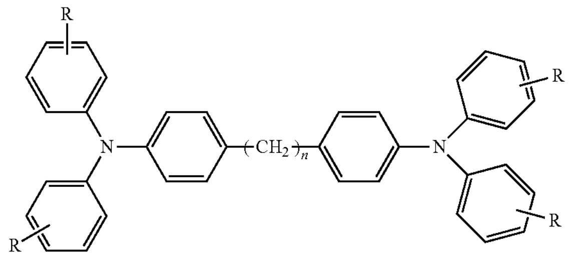
Formula (19)
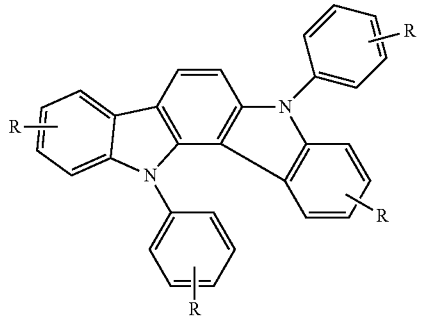
Formula (20)
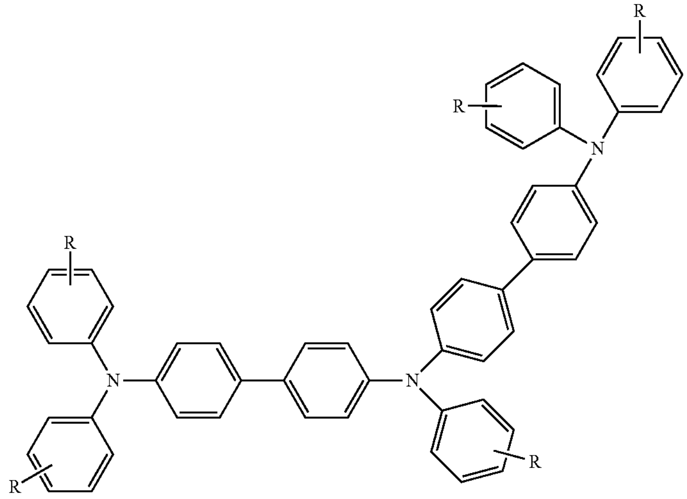
Formula (21)
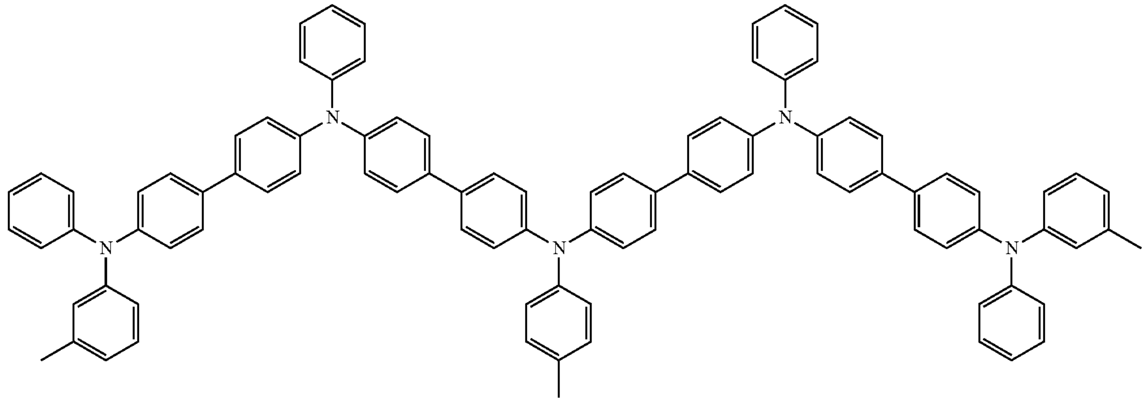

-continued
Formula (22)
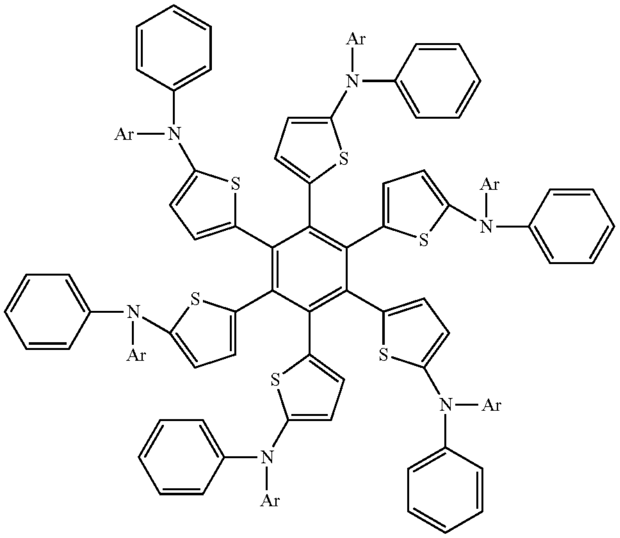
Formula (23)
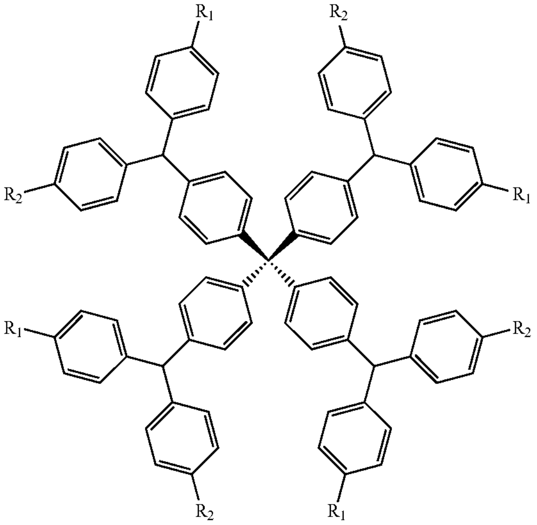
Formula (24)
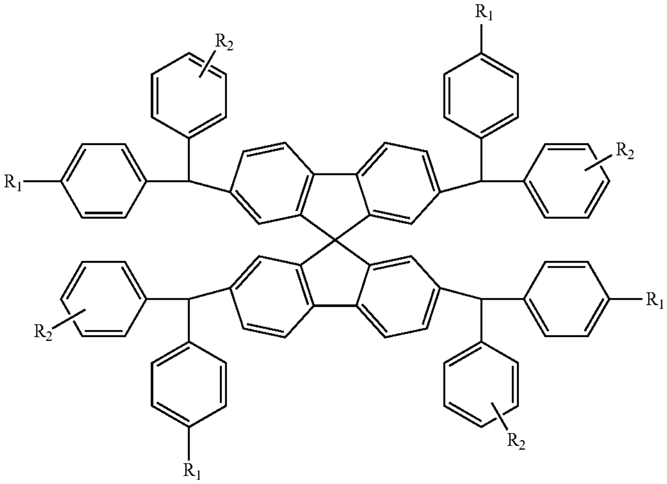
wherein each R, $R_1$, and $R_2$ substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; R' is alkyl; n is an integer from 1 to 6; and Ar is independently selected from aryl, heteroaryl, substituted aryl, and substituted heteroaryl.

In particular embodiments, the molecular glass is selected from the group consisting of 4,4'-(1,4-phenylenediisopropylidene)bisphenol, tetrakis(4-hydroxyphenyl)silane, tetrakis(3-hydroxyphenyl)silane, tetrakis(2-hydroxyphenyl)silane; tetrakis(4-hydroxybiphenyl)silane, tetrakis(3-[3-hydroxybiphenyl])silane, tetrakis(4-[3-hydroxybiphenyl])silane, tetrakis(3-[4-hydroxybiphenyl])silane, tetrakis(4-[4-hydroxybiphenyl])silane, tetrakis(3-methoxyphenyl)silane, tetrakis(4-methoxyphenyl)silane, tetrakis(3-[3-methoxybiphenyl])silane, tetrakis(4-[3-methoxybiphenyl])silane, tetrakis(3-[4-methoxybiphenyl])silane, tetrakis(4-[4-methoxybiphenyl])silane, tri(2-adamantyloxymethyl cholate)-3-yl adamantan-1,3,5-tricarboxylate, tri{[(2-methyl-2-adamantyl)oxy]carbonylmethylcholate}-3-yl-adamantan-1,3,5-tricarboxylate, adamantane-1,3,5-triyltris(oxymethylene) tricholate, adamantane-1,3,5-triyltris(oxymethylene)tri-3-(2-adamantyloxymethoxy)cholate, tri(2-methyl-2-adamantyl)adamantan-1,3,5-tricarboxylate, 1,3,4-tri[(2-adamantyloxymethyl cholate)-3-oxymethyloxy]adamantane, 1,2,3,4,6-penta-O-(2-adamanthyloxymethyl)-alpha-D-glucose, 1,2,3,4,6-penta-O-{[(2-methyl-2-adamantyl)oxy]carbonylmethyl}alpha-D-glucose, Formula (1a), Formula (2a), and structures (a) through (e):

Formula (1a)

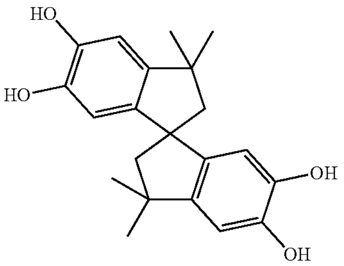

Formula (2a)

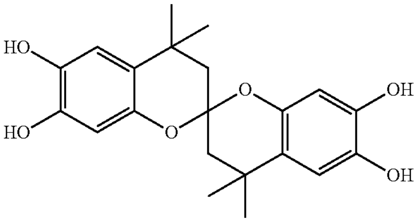

Formula (a)

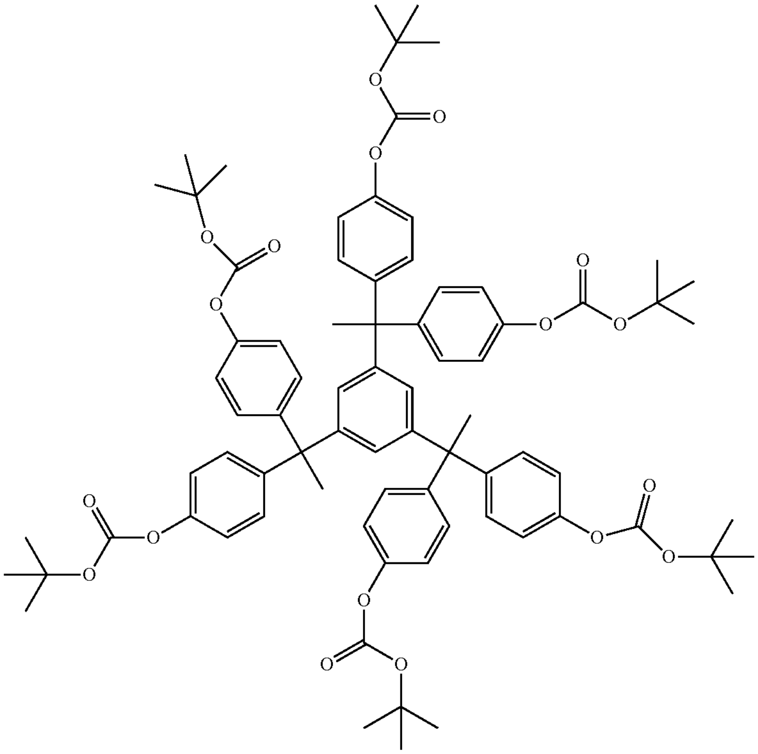

-continued
Formula (b)
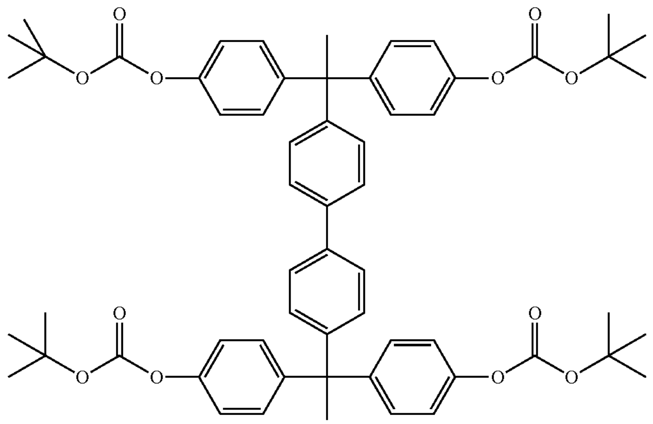
Formula (c)
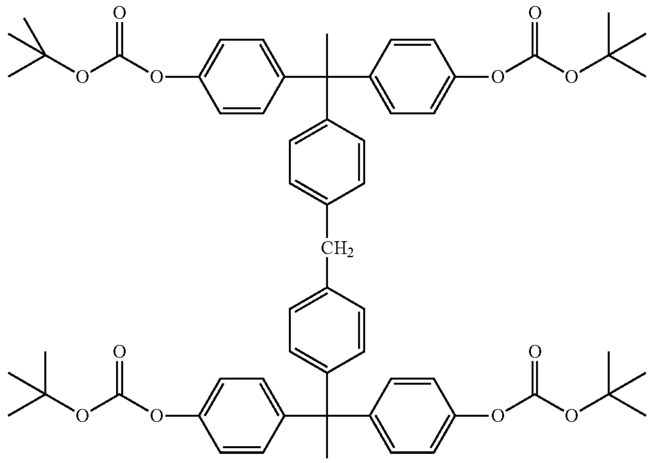
Formula (d)
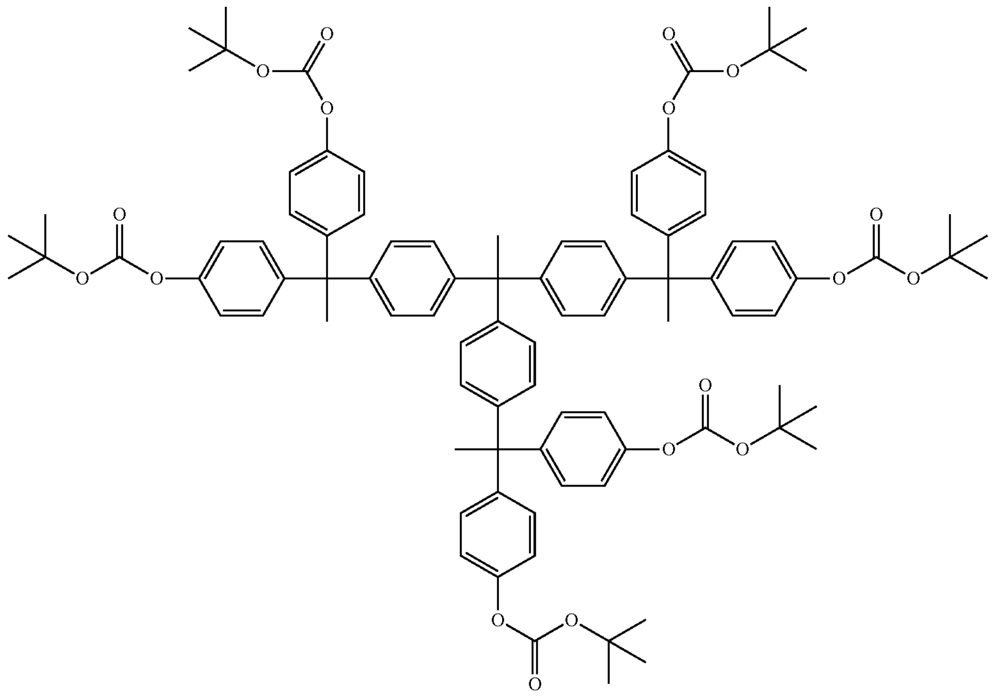

-continued

Formula (e)

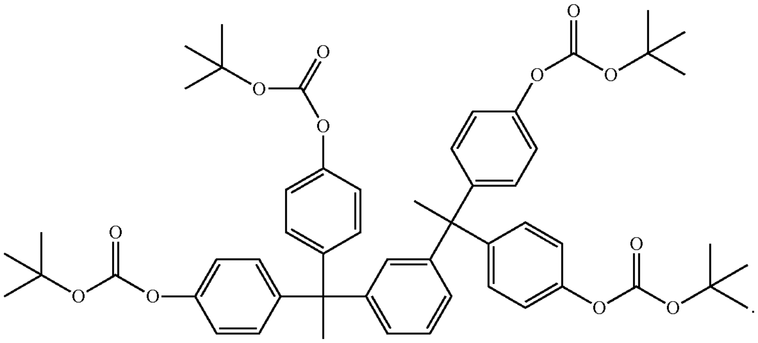

The molecular glass may be a dendrimer. The molecular glass may also be crosslinked with itself or an amorphous molecular material.

The non-amorphous semiconductor material may be represented by Formula (Ia) or (Ib):

Formula (Ia)

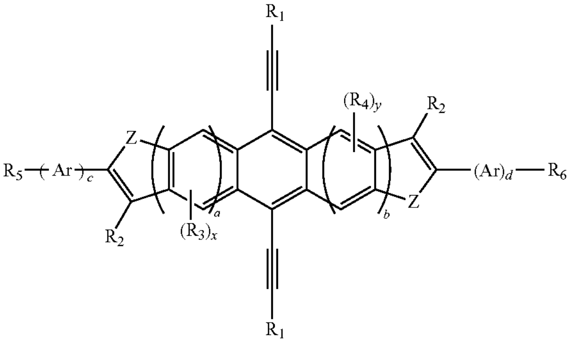

Formula (Ib)

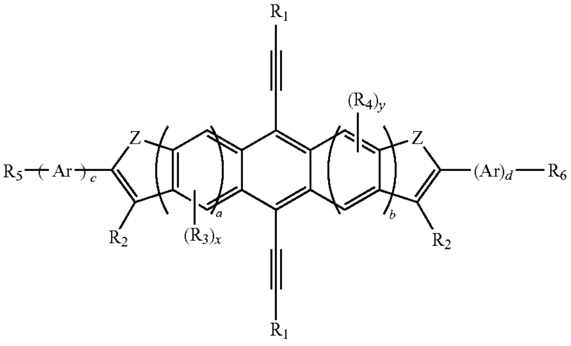

wherein $R_1$ and $R_2$ are independently selected from hydrogen, alkyl, aryl, alkoxy, substituted alkyl, substituted aryl, substituted alkoxy, trialkylsilyl, cyano, nitro, or a halogen; $R_3$ and $R_4$ are independently selected from alkyl, aryl, alkoxy, substituted alkyl, substituted aryl, substituted alkoxy, hydrogen, trialkylsilyl, cyano, nitro, or a halogen; $R_5$ and $R_6$ are independently selected from hydrogen, halogen, cyano, nitro, alkyl, aryl, alkoxy, substituted alkyl, substituted aryl, substituted alkoxy, or trialkylsilyl; Ar is independently selected from aryl, heteroaryl, substituted aryl, and substituted heteroaryl; Z represents —CH═CH—, sulfur, oxygen, selenium, or NR, wherein R is hydrogen or a hydrocarbon such as alkyl or aryl; x and y are independently from 0 to about 6; a and b are independently from 0 to about 3; and c and d are independently from 0 to about 4.

In some embodiments, the non-amorphous semiconductor material is represented by one of Formulas (25)-(41):

Formula (25a)

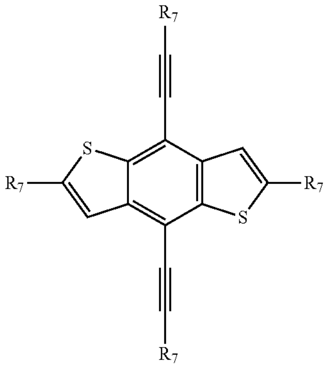

Formula (25b)

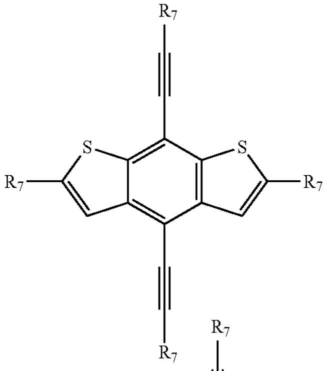

Formula (26a)

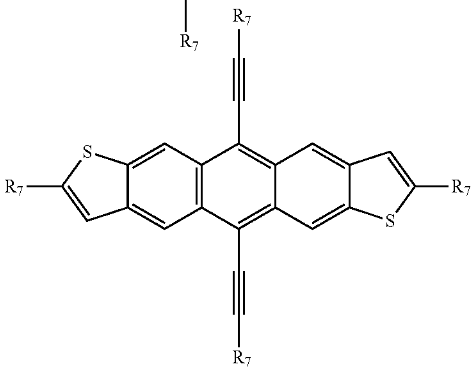

-continued
Formula (26b)
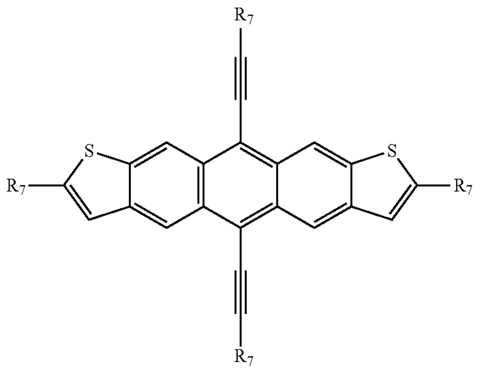
Formula (27a)
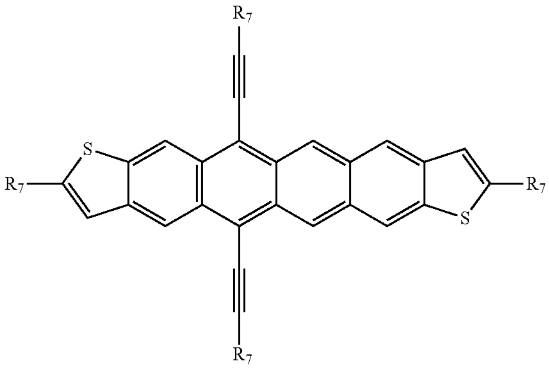
Formula (27b)
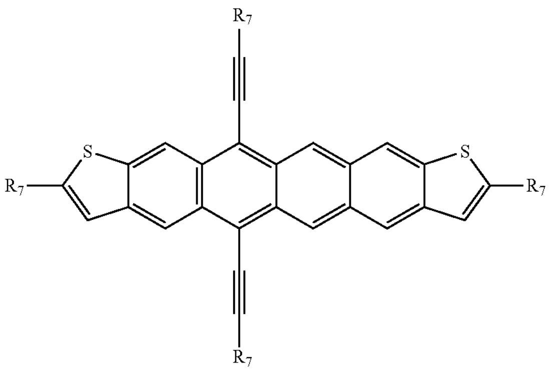
Formula (28a)
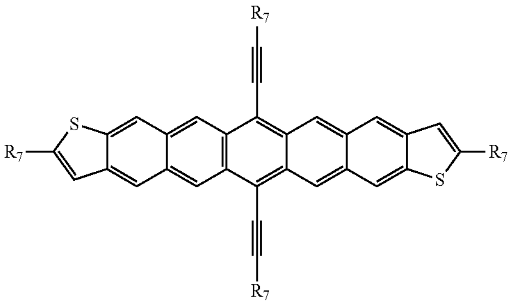
-continued
Formula (28b)
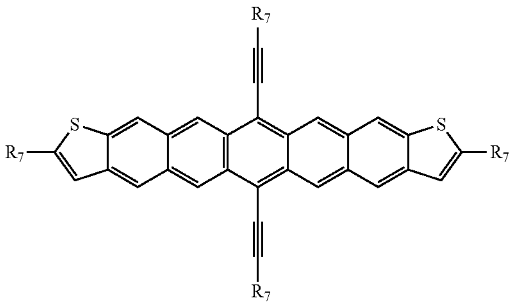
Formula (29a)
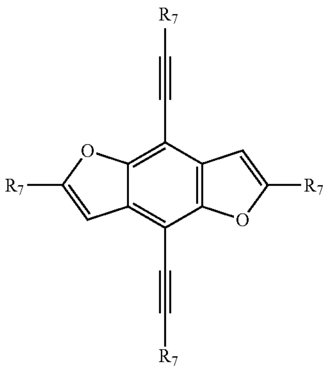
Formula (29b)
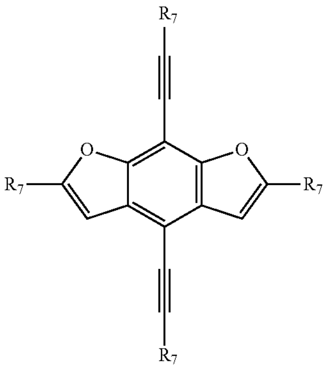
Formula (30a)
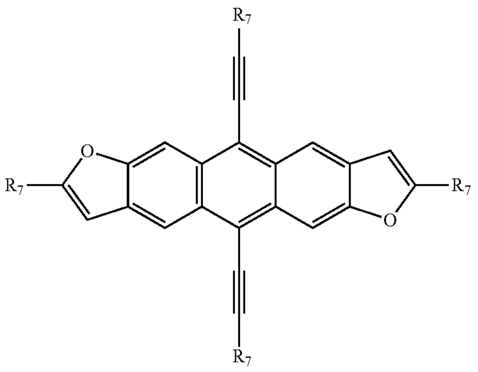

-continued
Formula (30b)
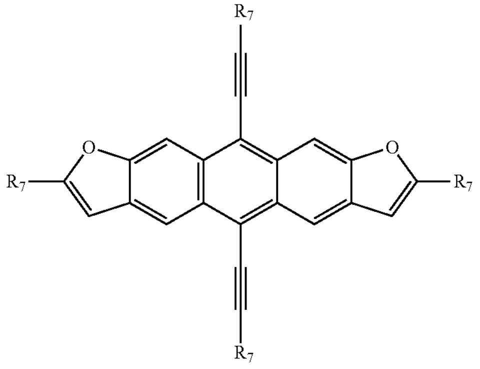
Formula (31a)
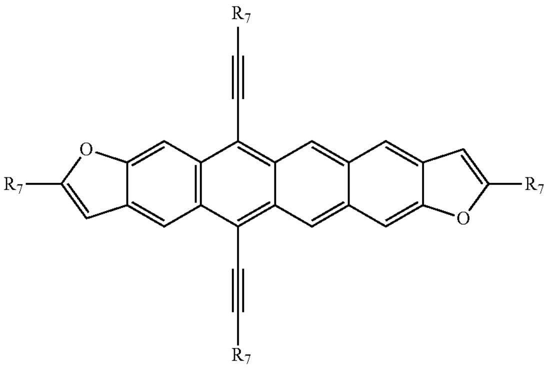
Formula (31b)
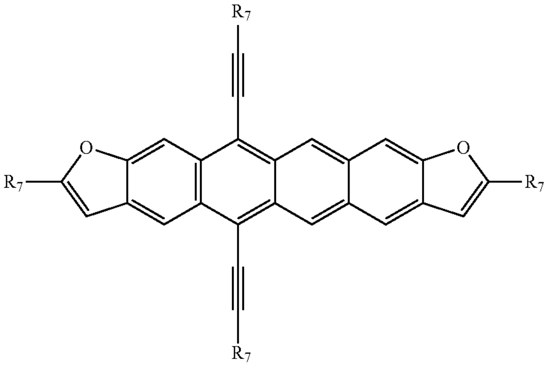
Formula (32a)
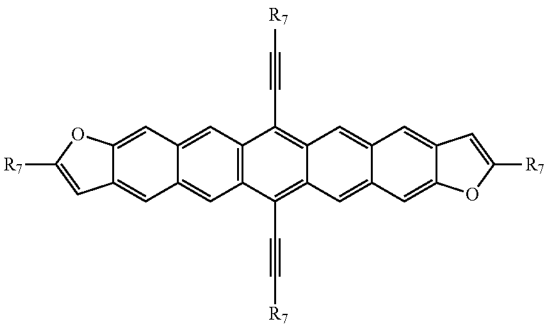
-continued
Formula (32b)
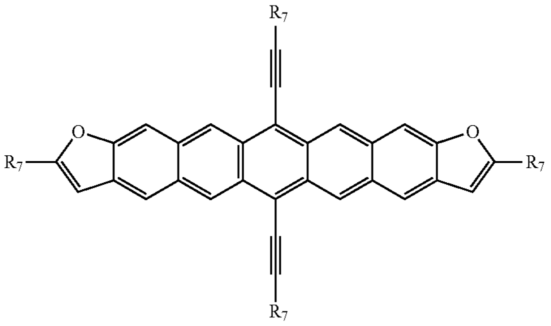
Formula (33a)
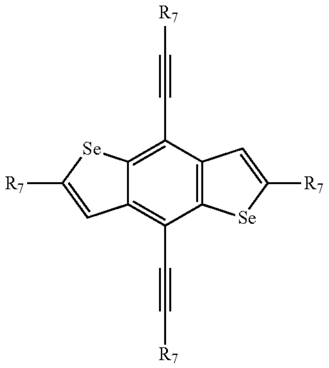
Formula (33b)
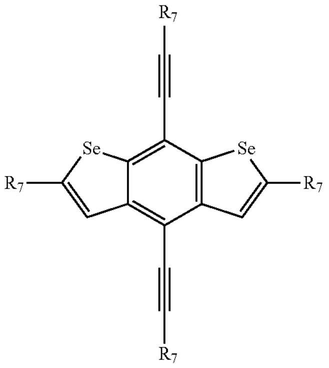
Formula (34a)
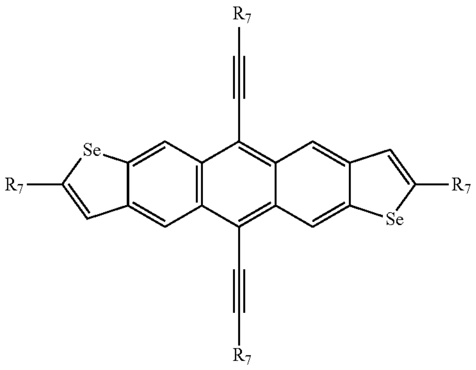

-continued
Formula (34b)
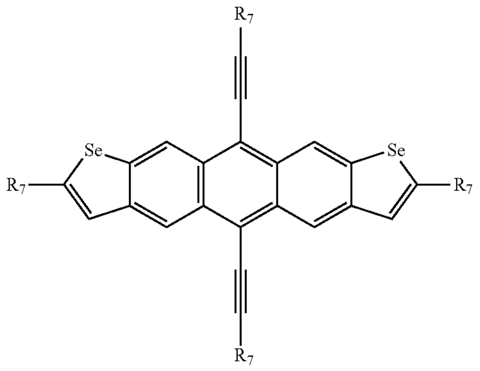
Formula (35a)
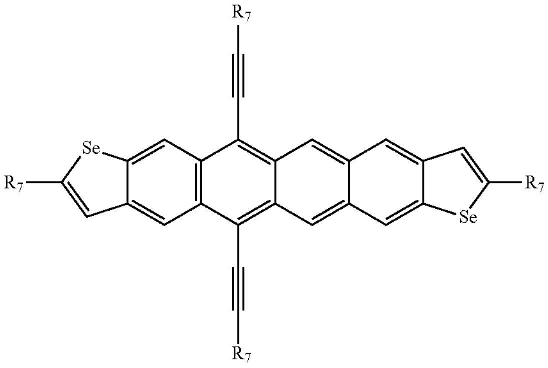
Formula (35b)
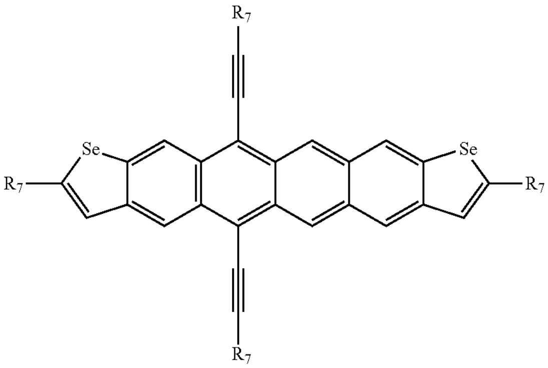
Formula (36a)
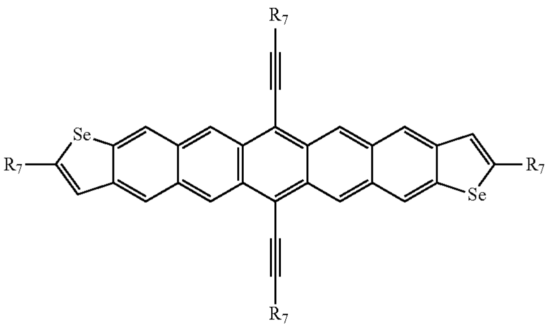
-continued
Formula (36b)
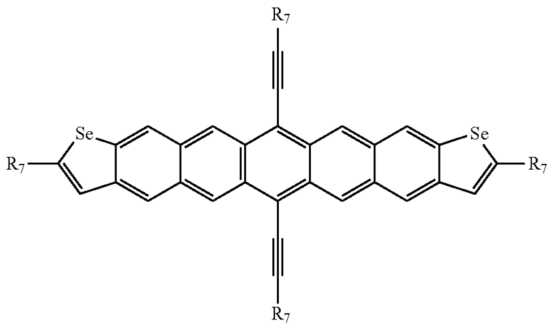
Formula (37a)
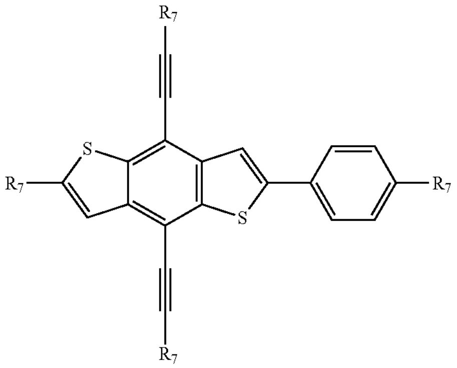
Formula (37b)
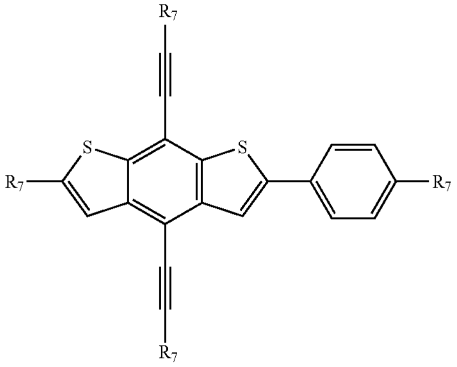
Formula (38a)
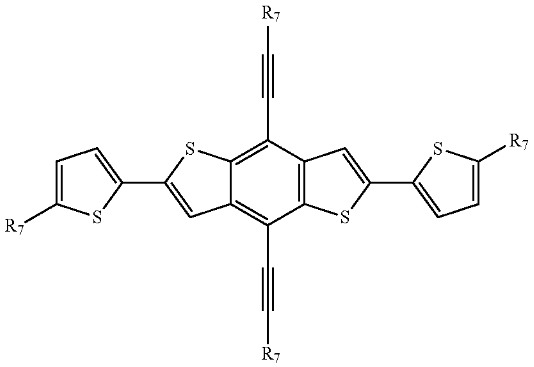

-continued
Formula (38b)
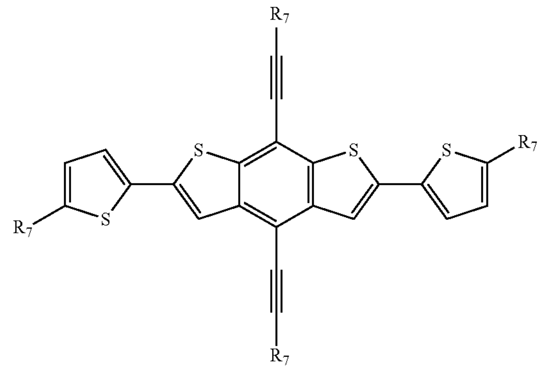
Formula (39a)
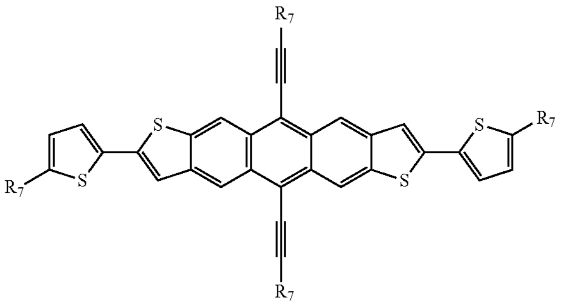
Formula (39b)
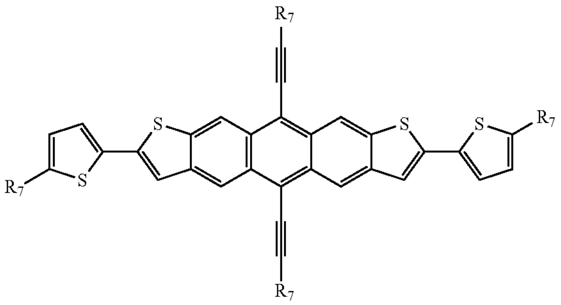
Formula (40a)
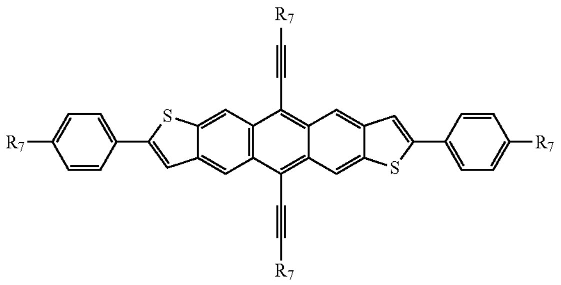
-continued
Formula (40b)
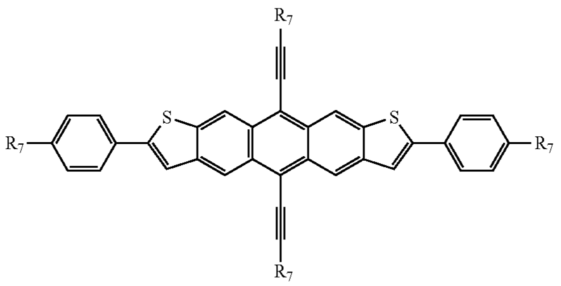
Formula (41)
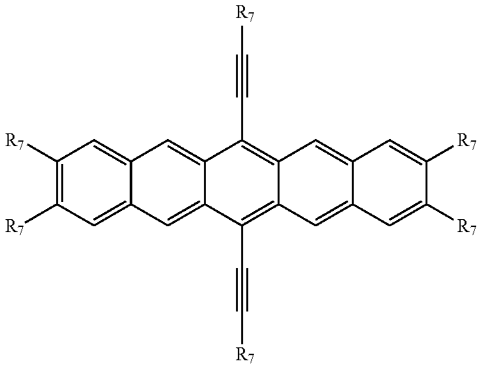
wherein $R_7$ is independently selected from the group consisting of hydrogen, halogen, alkyl, phenyl substituted with one alkyl chain, or trialkylsilyl.
In other embodiments, the semiconductor material is represented by one of Formulas (42)-(45):
Formula (42)
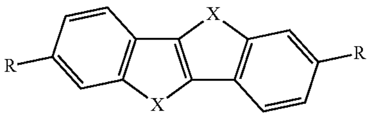
Formula (43a)
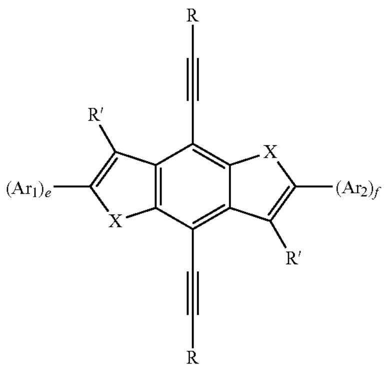

-continued

Formula (43b)

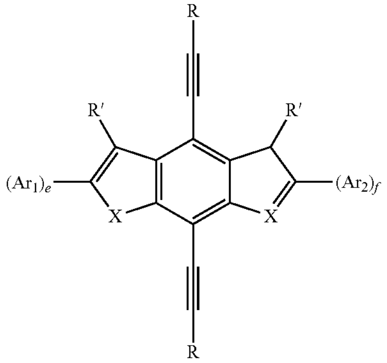

Formula (44a)

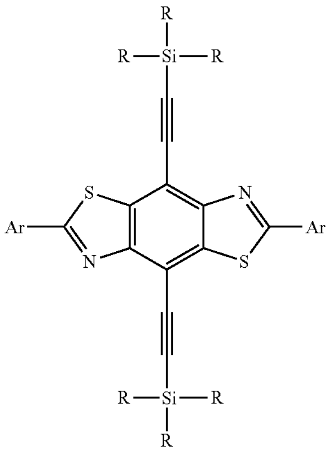

Formula (44b)

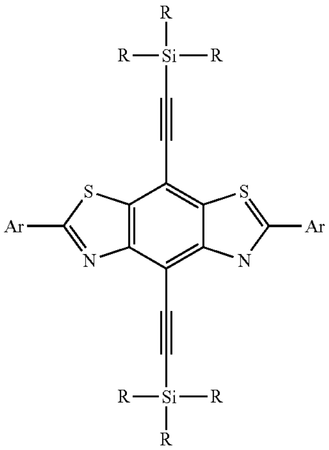

-continued

Formula (45)

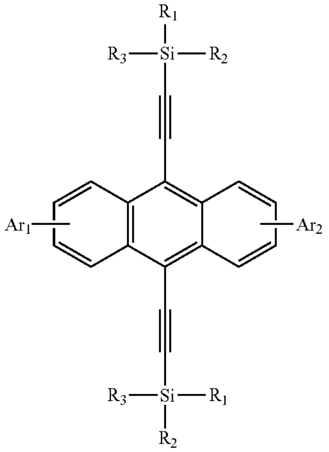

wherein R, R', $R_1$, $R_2$, and $R_3$ are independently selected from the group consisting of alkyl, perfluoroalkyl, aryl, alkoxy, and trialkysilyl; X is O, S, Se, or —NH; e and f are independently from 0 to about 4; and $Ar_1$ and $Ar_2$ are independently selected from aryl, heteroaryl, substituted aryl, and substituted heteroaryl.

$Ar_1$ and $Ar_2$ may be independently selected from the group consisting of

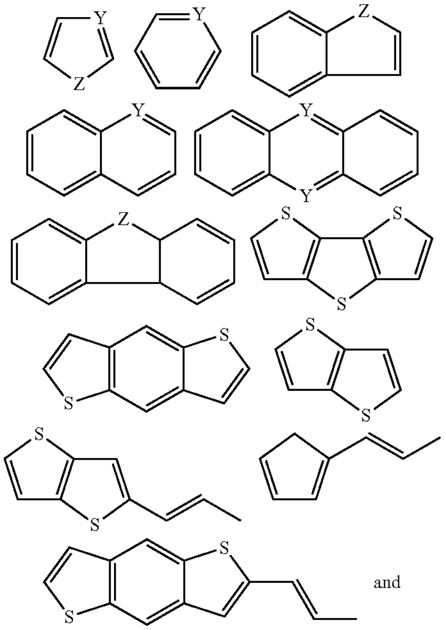

and

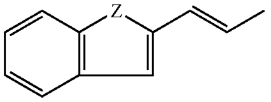

wherein Z is selected from the group consisting of C(R'R"), O, S, Se, NR'", and Si(R'R"), and wherein R', R", and R'" are independently selected from the group consisting of hydrogen, alkyl, or aryl; and Y is a carbon atom or a nitrogen atom.

In particular embodiments, the non-amorphous semiconductor material is represented by one of Formulas (46) and (47):

Formula (46)

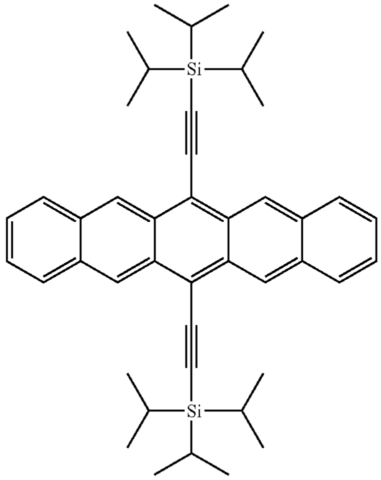

Formula (47a)

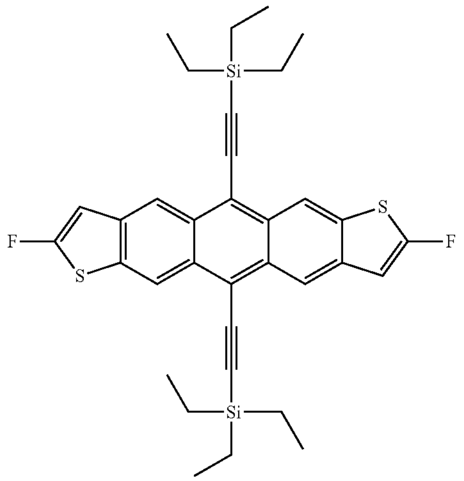

Formula (47b)

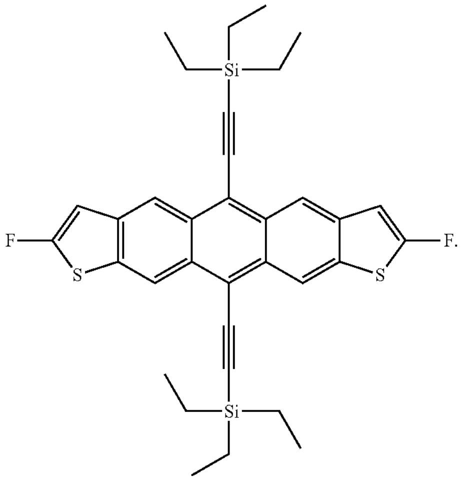

The non-amorphous semiconductor material may be a crystalline, semicrystalline, or liquid crystalline semiconductor. In further aspects, the semiconductor material is a small molecule and is a highly crystalline semiconductor. The molecular glass may have a dielectric constant less than 4.0, including a dielectric constant less than 3.5.

Further disclosed are electronic devices that comprise a semiconducting layer. The semiconducting layer comprises a non-amorphous semiconductor material and a molecular glass. The electronic device may be a thin-film transistor.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
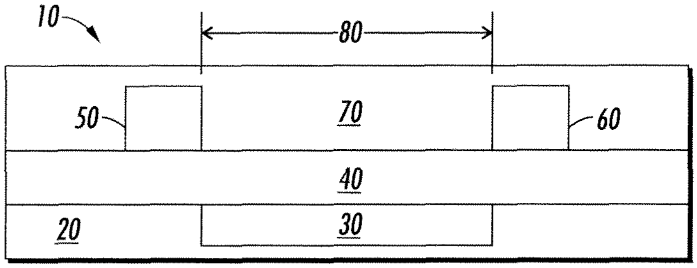
FIG. 1 represents a first embodiment of a TFT according to the present disclosure.

A more complete understanding of the components, processes, and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

As used herein, a "hydrocarbon group" is a chemical group composed of only carbon and hydrogen. Exemplary hydrocarbon groups include, but are not limited to, alkyl, aryl, alkylaryl, and arylalkyl.

The term "alkyl" refers to a radical composed entirely of carbon atoms and hydrogen atoms which is fully saturated and of the formula $C_nH_{2n+1}$. The alkyl radical may be linear, branched, or cyclic. The term "aryl" refers to an aromatic radical composed entirely of carbon atoms and hydrogen atoms. The term "alkoxy" refers to an alkyl radical which is attached to an oxygen atom.

The substituted alkyl, substituted aryl, and substituted alkoxy groups can be substituted with, for example, alkyl, halogen, —CN, and —$NO_2$. An exemplary substituted alkyl group is a perhaloalkyl group, wherein all of the hydrogen atoms in an alkyl group are replaced with halogen atoms, such as fluorine, chlorine, iodine, and bromine. The term "heteroatom-containing group" refers to a radical which is originally composed of carbon atoms and hydrogen atoms that forms a linear backbone, a branched backbone, or a cyclic backbone. This original radical is saturated or unsaturated. One or more of the carbon atoms in the backbone is then replaced by a heteroatom, generally nitrogen, oxygen, or sulfur, to obtain a heteroatom-containing group. The term "heteroaryl" refers generally to an aromatic compound containing at least one heteroatom replacing a carbon atom, and may be considered a subset of heteroatom-containing groups.

FIG. 1 illustrates a bottom-gate bottom-contact TFT configuration according to the present disclosure. The TFT 10 comprises a substrate 20 in contact with the gate electrode 30 and a gate dielectric layer 40. Although here the gate electrode 30 is depicted within the substrate 20, this is not required. However, it is important that the gate dielectric layer 40 separates the gate electrode 30 from the source electrode 50, drain electrode 60, and the semiconducting layer 70. The semiconducting layer 70 runs over and between the source and drain electrodes 50 and 60. The semiconductor has a channel length 80 between the source and drain electrodes 50 and 60.

Figure 2:
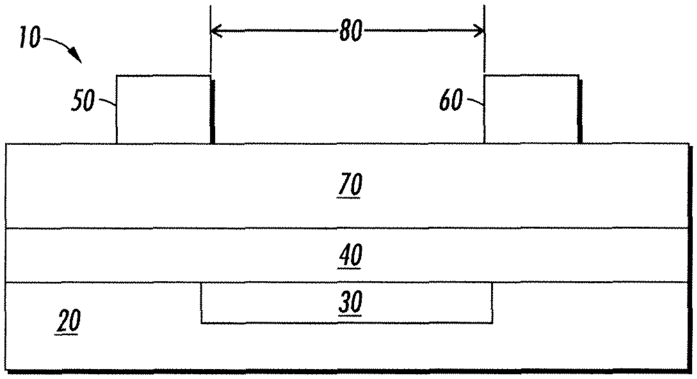
FIG. 2 represents a second embodiment of a TFT according to the present disclosure.

FIG. 2 illustrates another bottom-gate top-contact TFT configuration according to the present disclosure. The TFT 10 comprises a substrate 20 in contact with the gate electrode 30 and a gate dielectric layer 40. The semiconducting layer 70 is placed on top of the gate dielectric layer 40 and separates it from the source and drain electrodes 50 and 60.

Figure 3:
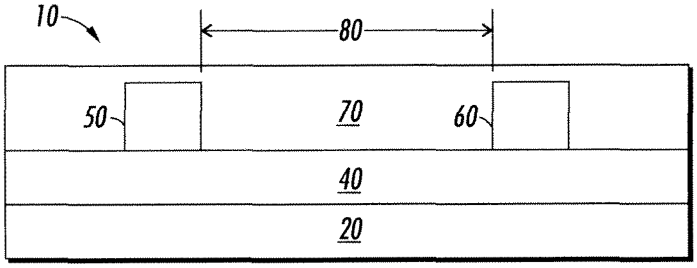
FIG. 3 represents a third embodiment of a TFT according to the present disclosure.

FIG. 3 illustrates a bottom-gate bottom-contact TFT configuration according to the present disclosure. The TFT 10 comprises a substrate 20 which also acts as the gate electrode and is in contact with a gate dielectric layer 40. The source electrode 50, drain electrode 60, and semiconducting layer 70 are located atop the gate dielectric layer 50.

Figure 4:
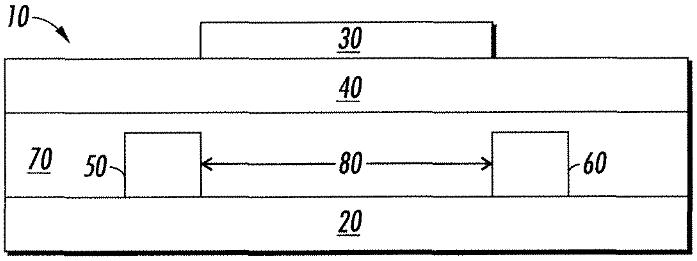
FIG. 4 represents a fourth embodiment of a TFT according to the present disclosure.

FIG. 4 illustrates a top-gate top-contact TFT configuration according to the present disclosure. The TFT 10 comprises a substrate 20 in contact with the source electrode 50, drain electrode 60, and the semiconducting layer 70. The semiconducting layer 70 runs over and between the source and drain electrodes 50 and 60. The gate dielectric layer 40 is on top of the semiconducting layer 70. The gate electrode 30 is on top of the gate dielectric layer 40 and does not contact the semiconducting layer 70.

The semiconducting layer of an electronic device, such as a thin film transistor or a light emitting diode (LED) can be formed from a semiconducting composition comprising a non-amorphous semiconductor material and a molecular glass.

The semiconducting composition comprises an amorphous molecular material, also known as a molecular glass. In some embodiments, the molecular glass is not crosslinked. In other embodiments, the molecular glass is crosslinked to form a matrix or network. In further embodiments, a crosslinking agent is used together with the molecular glass to form a matrix or network comprising both the molecular glass and the crosslinking agent for the semiconducting layer. In other embodiments, the molecular glass is self-crosslinked to form a network for the semiconducting layer. In other embodiments, a molecular glass is crosslinked with a different molecular glass to form a network for the semiconducting layer. It is understood that the chemical structure of the molecular glass may change slightly after crosslinking due to the chemical reaction between the functional groups, and/or elimination of some small molecular component.

Molecular glasses are amorphous molecular materials which show a glass transition temperature (preferably significantly higher than room temperature) rather than a melting point. Unlike other small molecules, the unique glass forming properties are due to an inability to crystallize. Therefore, the disclosed molecules can be trapped in a kinetically stable amorphous state. As a result, they are small molecules capable of forming amorphous films. A molecular glass can be characterized by the disorder in both intermolecular distance and/or orientation, and the presence of free volume, using for example, X-ray diffraction techniques.

The disclosed amorphous molecular glass combines the beneficial aspects of small molecules along with many of the favorable aspects of polymers. Such amorphous molecular materials have a well-defined structure, unlike polymeric materials, and can be highly purified to be electronic grade, for example with purity greater than 95%, greater than 99%, or greater than 99.5%. In addition, amorphous molecular materials offer some benefits similar to polymeric materials, such as high thermal stability and the ability to form a thin film. The uniform distribution of functional groups in the amorphous molecular glass (and the crosslinking agent) allows for high crosslinking density in the semiconducting layer.

Any suitable amorphous molecular material can be used. When viewing the three dimensional structure of the molecule, the disclosed amorphous molecular materials may have linear (I), T-type (II), tripodal (III), or tetrahedral (IV) structures as shown below. The molecular shape defines molecular flexibility as well as packing ability. In specific embodiments, the amorphous molecular materials have the tripodal (III) or the tetrahedral structure (IV). The molecule itself may appear to have molecular symmetry such as axis symmetry (C2 and C3 symmetry and the like), plane of symmetry, or center of symmetry. However, in the semiconducting layer (solid state), there is a lack of long range ordering, like glass.

(I)

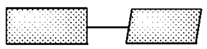

(II)

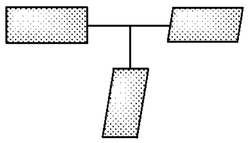

(III)

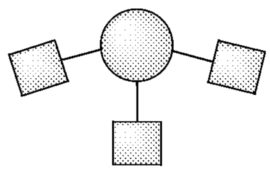

(IV)

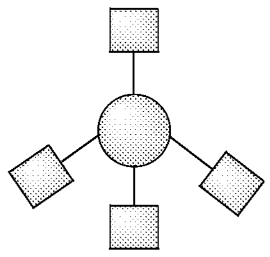

The amorphous molecular materials may have functional groups such as —OH (hydroxyl), $—NH_2$ (amino), —CNO (isocyanate), —COOH (carboxylic acid), —OR', —COOR', —OCOOR', epoxy, and the like, where R' is alkyl. These functional groups can be present on the rectangle and/or square moieties shown in the structures (I) to (IV). In view of the functional groups on the amorphous molecular materials, the amorphous molecular materials can be divided into, for example, phenolic molecular glass, amino molecular glass, carboxylic acid molecular glass, epoxy molecular glass, methoxy molecular glass, ester molecular glass, isocyanate molecular glass, etc.

In embodiments, the amorphous molecular materials can also be divided into different categories by the core component such as spiro based derivatives, bisphenol-A based derivatives, tetrahedral aryl silane based derivatives, adamantane based derivatives, cyclic or fused cyclic system based derivatives, triaryl amine based derivatives, and the like. In specific embodiments, the amorphous molecular material is a derivative of a Spiro compound, such as a spirobisindane compound or a spirobi[chromane] compound. Each ring of the Spiro compound has at least one functional group. In particular embodiments, the amorphous molecular material is the spirobisindane compound of Formula (1) or the spirobi[chromane] compound of Formula (2):

Formula (1)

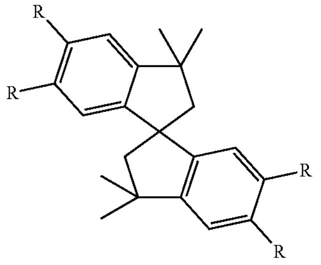

Formula (2)

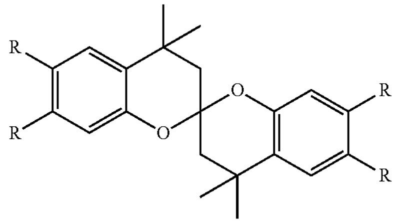

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; and R' is alkyl. In particular embodiments, each R substituent is independently selected from the group consisting of hydrogen, —OH, —$NH_2$, —$OC_2H_5$, —$OCH_3$, —$OCOOC_4H_9$, —CNO, —NHCOOR', —$C_6H_4OH$ (hydroxyphenyl), —COOH, and epoxy. In further embodiments, these particular compounds have more than one hydroxyl group or protected hydroxyl group (e.g. protected with a methoxy group, methoxycyclohexyl group, or the like) on each ring in the respective spiro compound. An exemplary compound of Formula (1) is 5,5',6,6'-tetrahydroxy-3,3,3',3'-tetramethyl-1,1'-spirobisindane (where each R is hydroxyl). An exemplary compound of Formula (2) is 6,6',7,7'-tetrahydroxy-4,4,4',4'-tetramethyl-2,2'-spirobis[chromane] (where each R is hydroxyl). These two exemplary compounds are illustrated as Formulas (1a) and (2a):

Formula (1a)

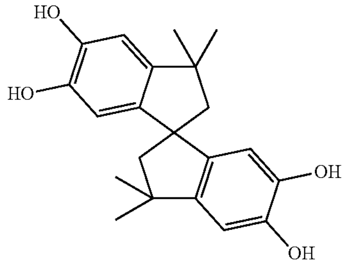

Formula (2a)

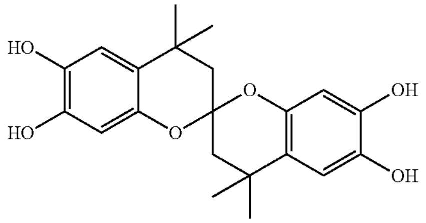

In other embodiments, the amorphous molecular material is a structure that is derivative of bisphenol-A. Exemplary derivatives include the compounds of Formula (3) to Formula (8):

Formula (3)

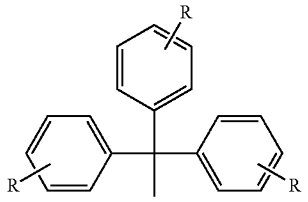

Formula (4)

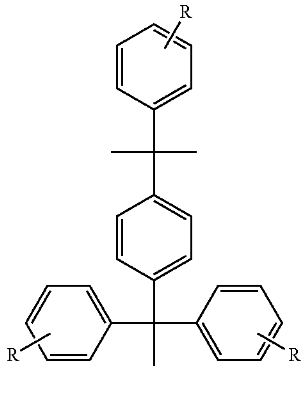

Formula (5)

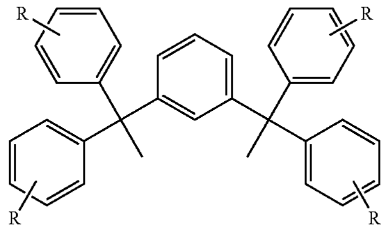

-continued

Formula (6)

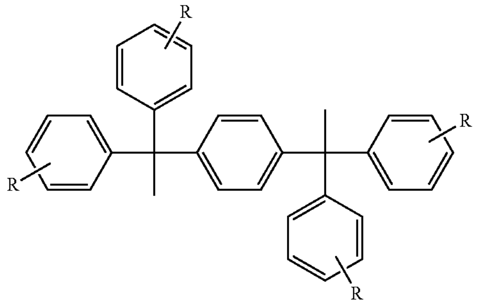

Formula (7)

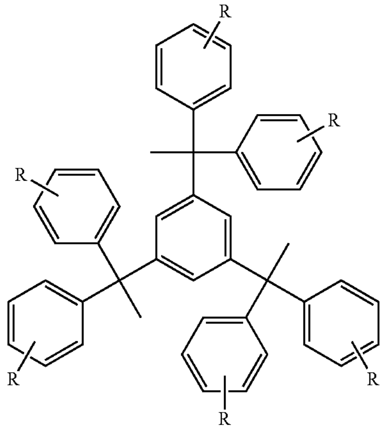

-continued

Formula (8)

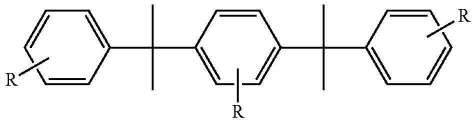

wherein each R is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; and R' is alkyl. In further embodiments, the R group is —OH or a protected —OH group such as $OCH_3$, $OCOOC_4H_9$, methoxycyclohexyl group, and the like. An exemplary compound of Formula (4) is a hydroxyphenyl derivative of 4,4'-(1,4-phenylenediisopropylidene)bisphenol. Other exemplary bisphenol-A based molecular glasses include structure (a) to structure (e):

(a)

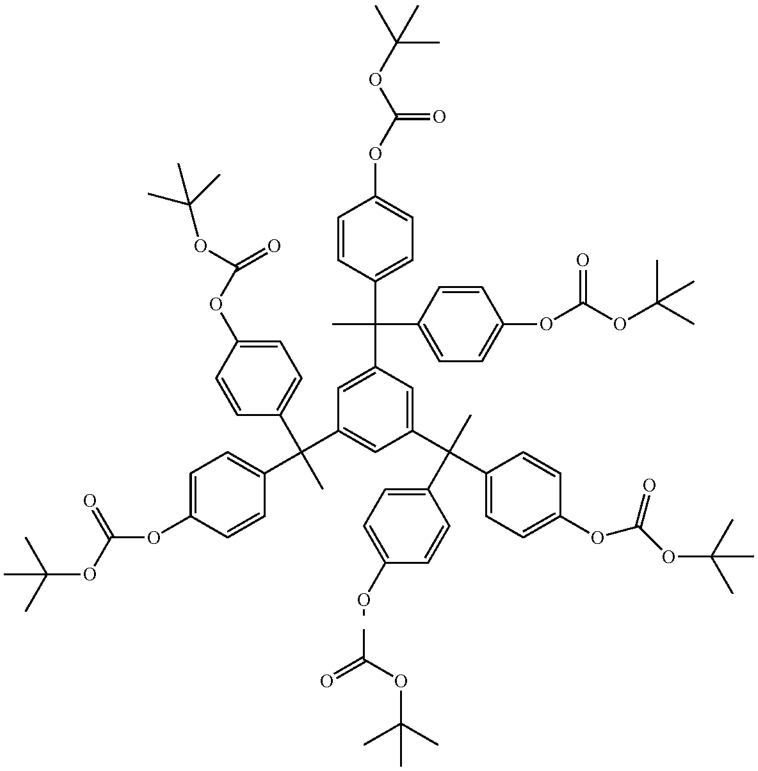

-continued
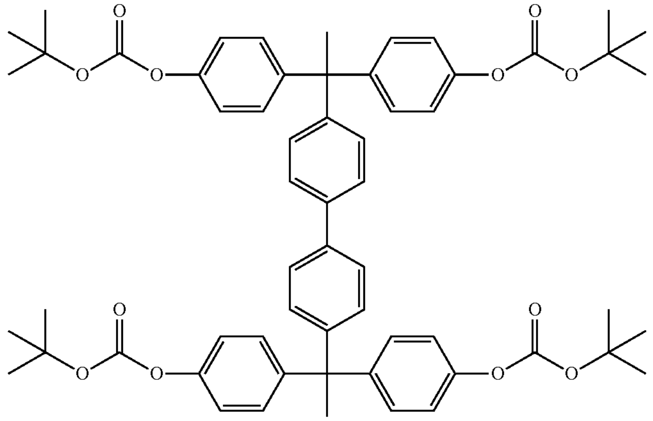
(b)
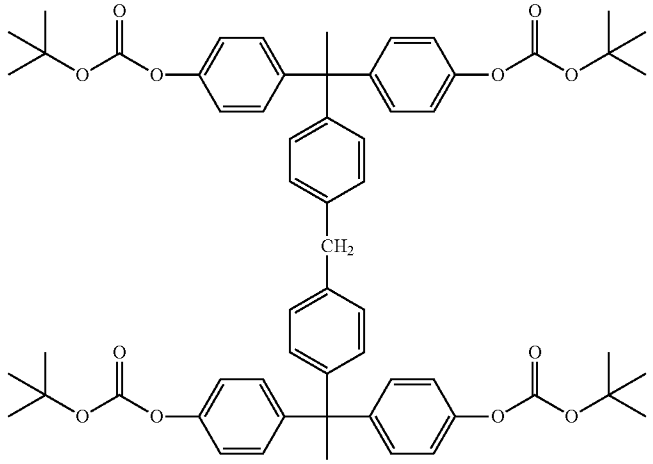
(c)
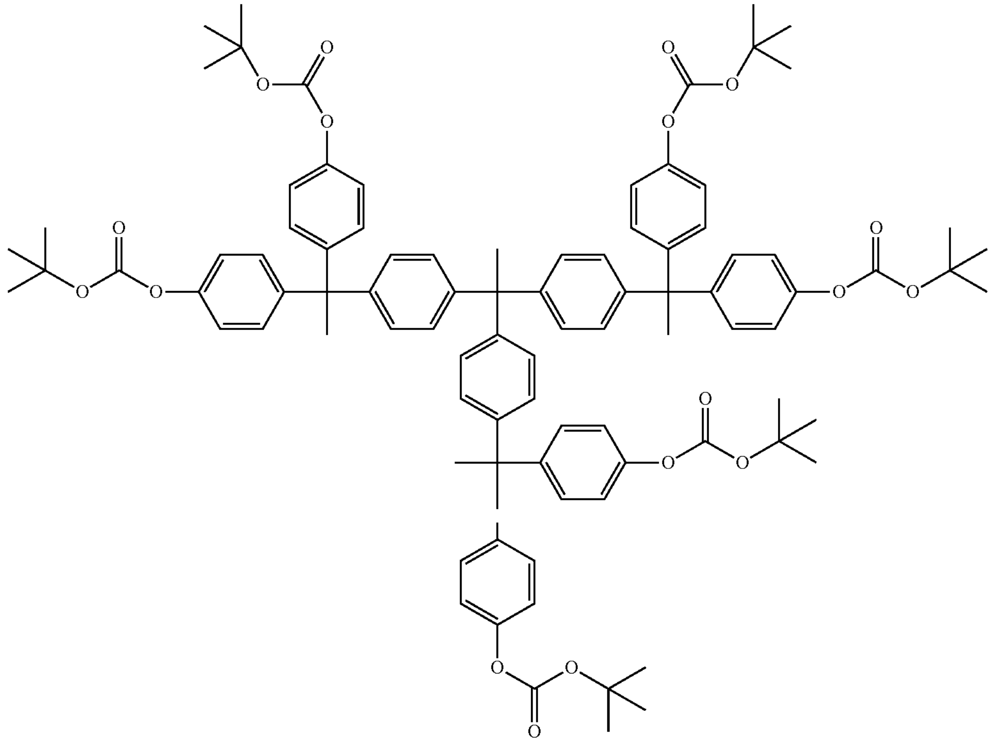
(d)

-continued (e)

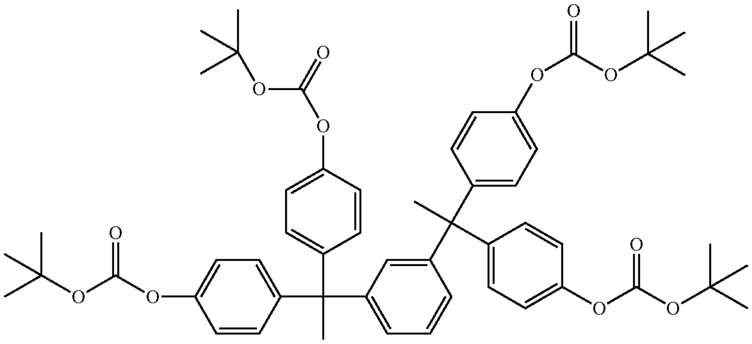

In other embodiments, the amorphous molecular material is a silane of Formula (9):

Formula (9)

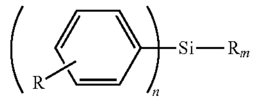

wherein each R is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; R' is alkyl; and m and n are both integers, wherein m+n=4.

In specific embodiments, the silane of Formula (9) has the structure of Formula (9a):

Formula (9a)

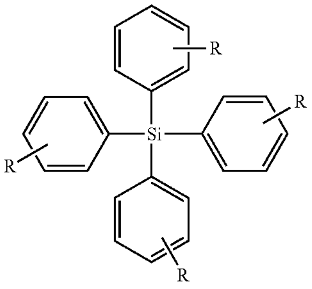

wherein each R is independently selected from the group consisting of hydrogen, —OH, —$NH_2$, —$OCH_3$, —$OC_2H_5$, —$OCOOC_4H_9$, —CNO, —NHCOOR', —$C_6H_4OH$ (hydroxyphenyl), —COOH, epoxy group, and the like. Exemplary embodiments of Formula (9) include, for example, tetrakis(4-hydroxyphenyl)silane, tetrakis(3-hydroxyphenyl)silane, tetrakis(2-hydroxyphenyl)silane; tetrakis(4-hydroxybiphenyl)silane, tetrakis(3-[3-hydroxybiphenyl])silane, tetrakis(4-[3-hydroxybiphenyl])silane, tetrakis(3-[4-hydroxybiphenyl])silane, tetrakis(4-[4-hydroxybiphenyl])silane, tetrakis(3-methoxyphenyl)silane, tetrakis(4-methoxyphenyl)silane, tetrakis(3-[3-methoxybiphenyl])silane, tetrakis(4-[3-methoxybiphenyl])silane, tetrakis(3-[4-methoxybiphenyl])silane, tetrakis(4-[4-methoxybiphenyl])silane, and mixtures thereof.

In other embodiments, the amorphous molecular material may be an adamantane based molecular glass of Formula (10):

Formula (10)

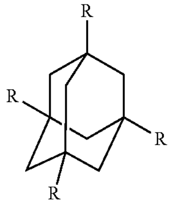

wherein each R is independently a substituent comprising a heteroatom such as oxygen and nitrogen. In further embodiments, R is a group containing acetal and/or ester moieties, e.g. glucose. In other embodiments, R includes one or more cholic acid groups. Exemplary R groups include, for example, structure (f) to structure (h):

(f)

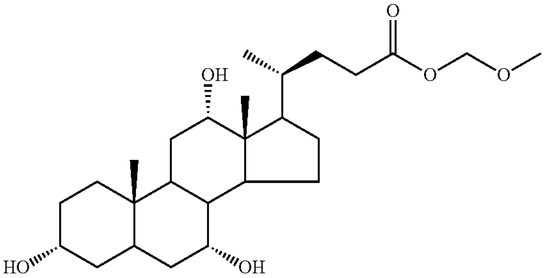

(g)

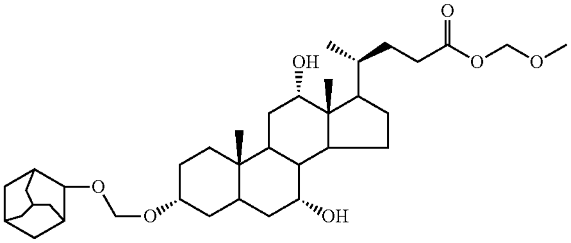

-continued (h)

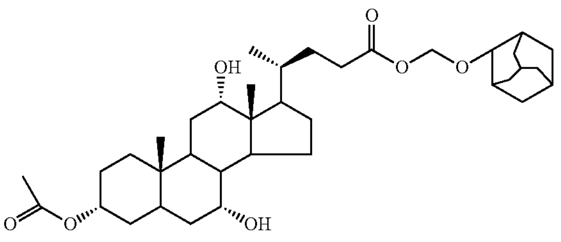

Exemplary adamantane based molecular glasses include tri(2-adamantyloxymethyl cholate)-3-yl-adamantan-1,3,5-tricarboxylate, tri{[(2-methyl-2-adamantyl)oxy]carbonylmethylcholate}-3-yl-adamantan-1,3,5-tricarboxylate, adamantane-1,3,5-triyltris(oxymethylene)tricholate, adamantane-1,3,5-triyltris(oxymethylene)-tri-3-(2-adamantyloxymethoxy)cholate, tri(2-methyl-2-adamantyl)adamantan-1,3,5-tricarboxylate, 1,3,4-tri[(2-adamantyloxymethylcholate)-3-oxymethyloxy]adamantane, 1,2,3,4,6-penta-O-(2-adamanthyloxymethyl)-alpha-D-glucose, 1,2,3,4,6-penta-O-{[(2-methyl-2-adamantyl)oxy]carbonylmethyl}-alpha-D-glucose, and the like.

In other embodiments, the amorphous molecular materials are cyclic or fused cyclic system based derivatives. The cyclic or fused cyclic core can be, for example, benzene, hexaphenybenzene, triphenylbenzene, naphthalene, anthracene, phenanthracene, pyrene, and the like. Exemplary molecular glasses having cyclic or fused cyclic systems include those having the structure of Formula (11) to Formula (13):

Formula (11)

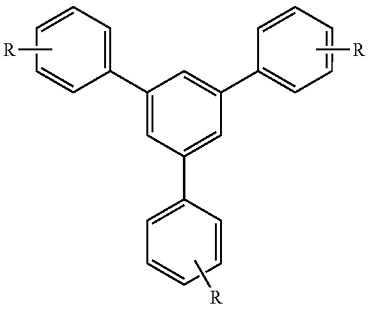

Formula (12)

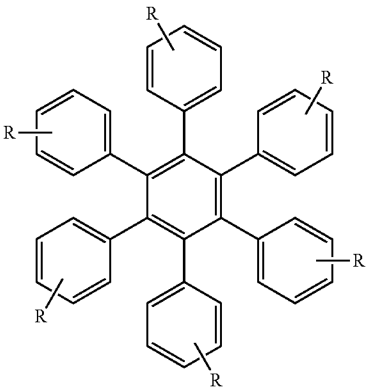

-continued

Formula (13)

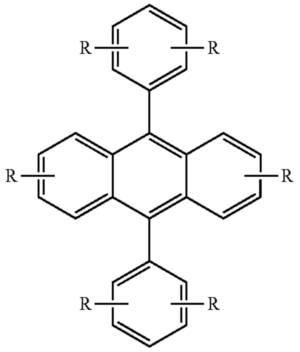

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; and R' is alkyl.

In other embodiments, the amorphous molecular material is a calixarene derivative as shown in Formula (14):

Formula (14)

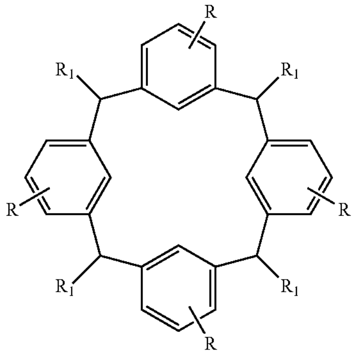

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; R' is alkyl; and each $R_1$ is a phenyl group substituted with an oxygen-containing radical. Exemplary $R_1$ groups include hydroxyphenyl, methoxyphenyl, butoxycarbonyloxybenzyl group, and the like. In further embodiments, the R group is independently —OH or protected —OH group such as —$OCH_3$, —$OCOOC_4H_9$, methoxycyclohexyl group, and the like.

The molecular glass may be a dendrimer, i.e. R may have a similar structure to the core. In some embodiments, the dendrimer is a G1, G2, or G3 dendrimer. Under dendrimer nomenclature, GX refers to the generation of the dendrimer wherein X is the dendrimer generation number. A dendrimer generation number of 1 refers to a molecular glass core structure surrounded by a single shell of similar structures. A G1 dendrimer of Formula (14-1) is shown below, along with other dendrimers of Formulas (14-2), (14-3), and (14-4):

Formula (14-1)
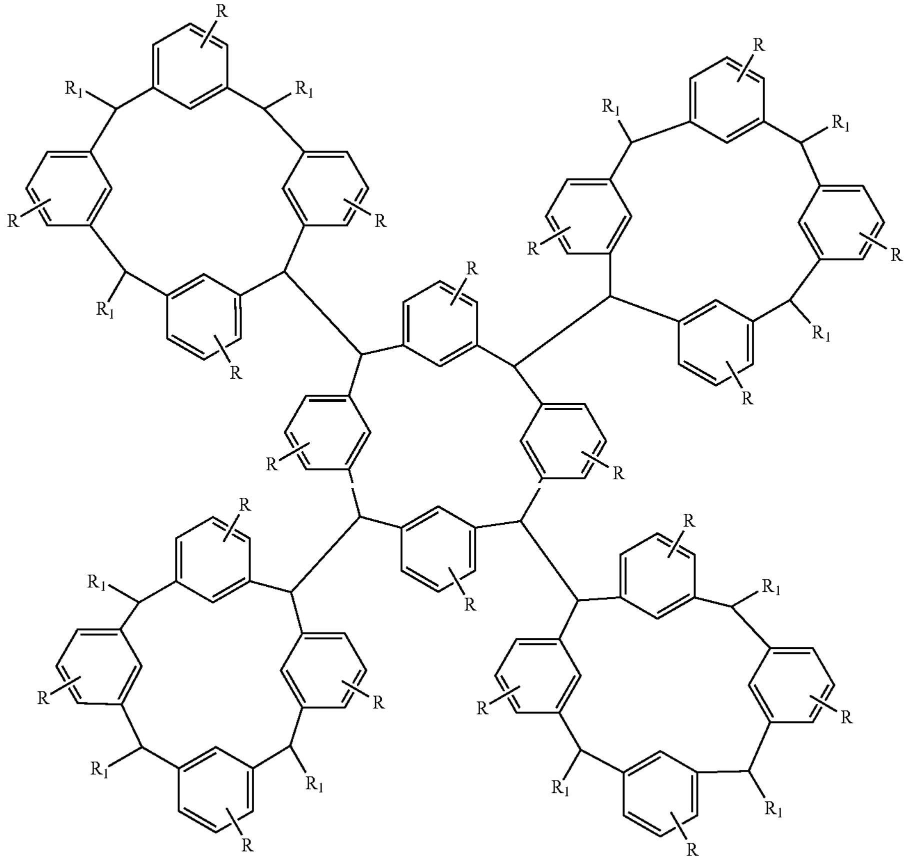
Formula (14-2)
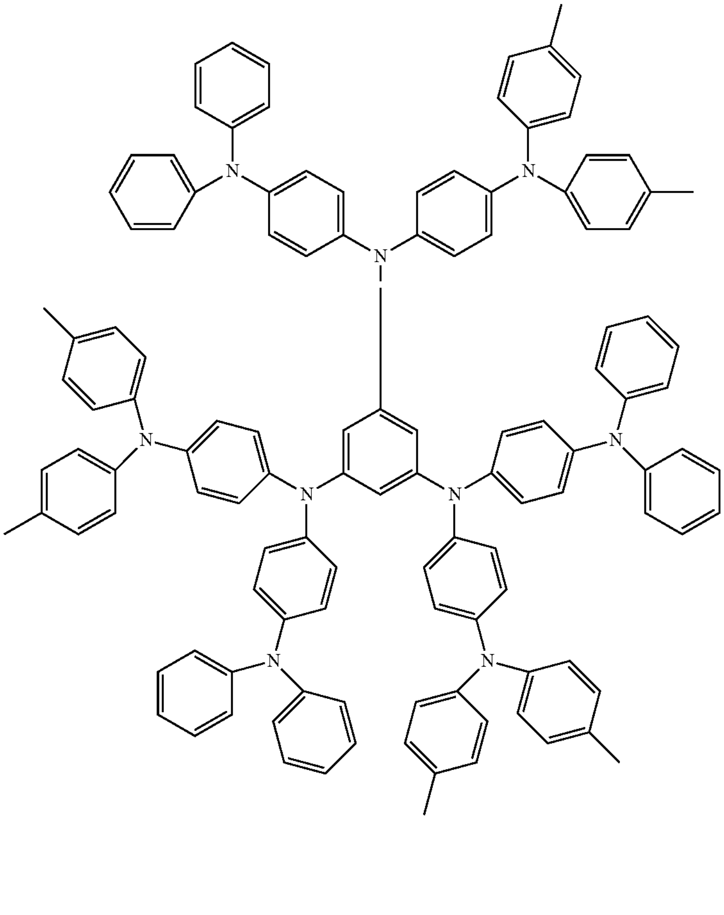

-continued
Formula (14-3)
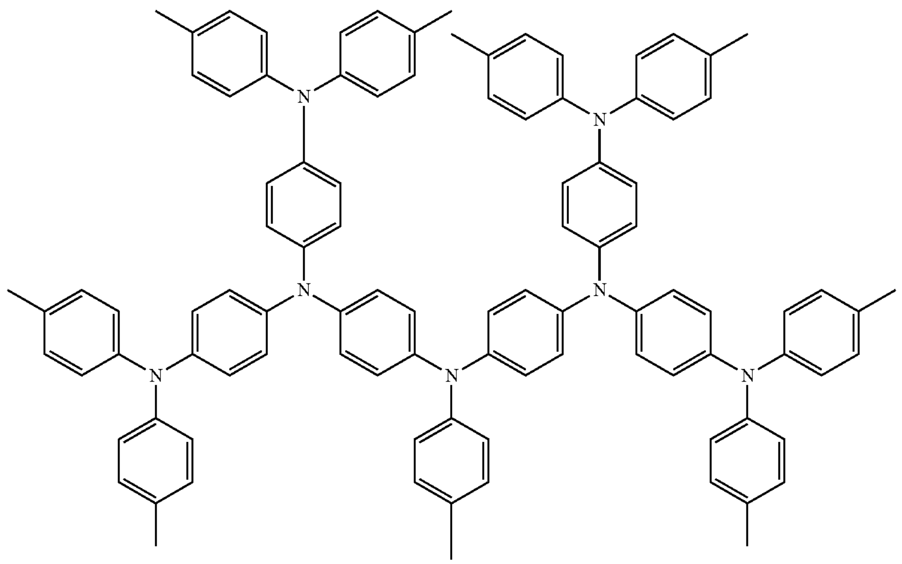
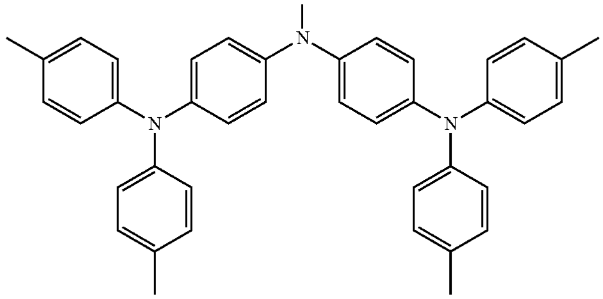
Formula (14-4)
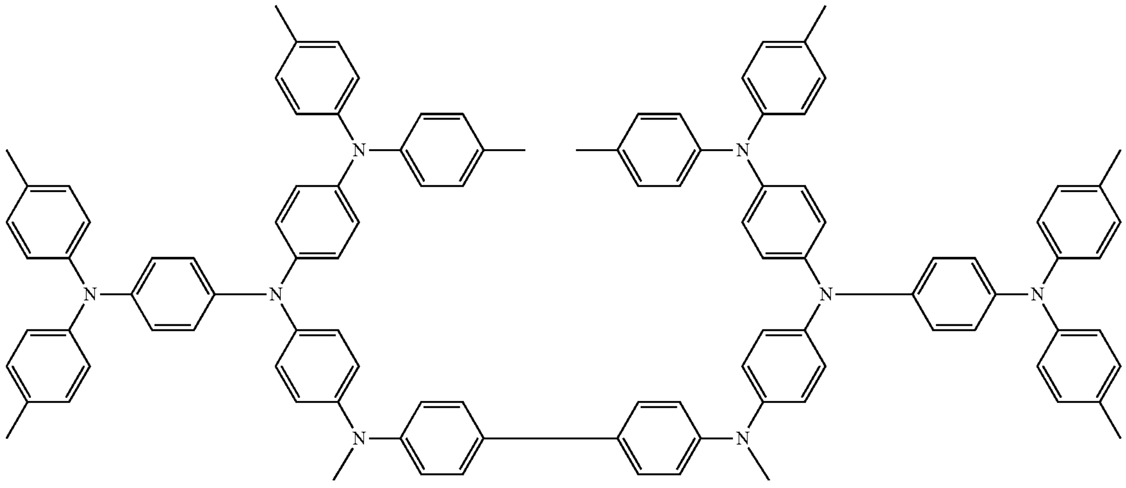

-continued

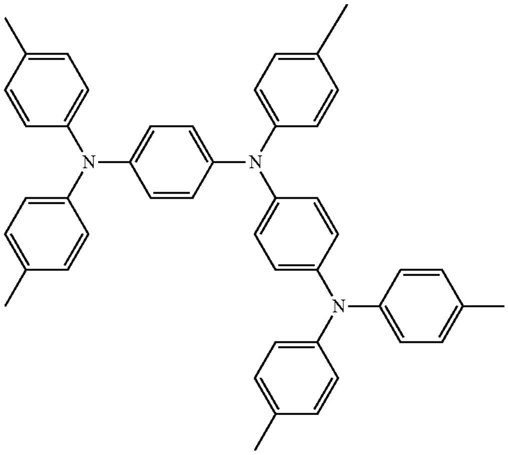

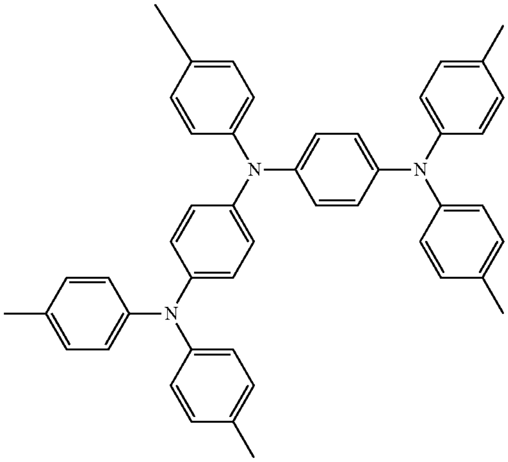

The four moieties surrounding the core make up a shell. In a G2 dendrimer, the $R_1$ groups of Formula (14-1) would be the structure depicted in Formula (14) or, in some embodiments, a different molecular glass structure, and would make up a second shell. Formulas (14-2) through (14-4) are other exemplary dendrimers; they do not correspond to Formula (14).

In some embodiments, the amorphous molecular material is an arylamine derivative of the following Formula (15) to Formula (24):

Formula (15)

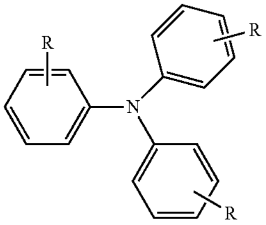

Formula (16)

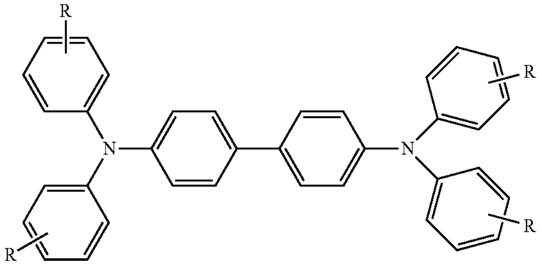

Formula (17)

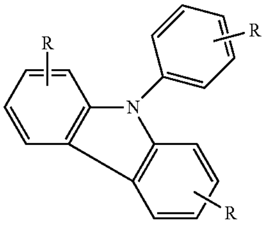

-continued
Formula (18)
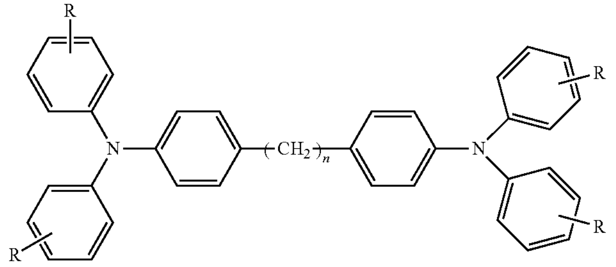
Formula (19)
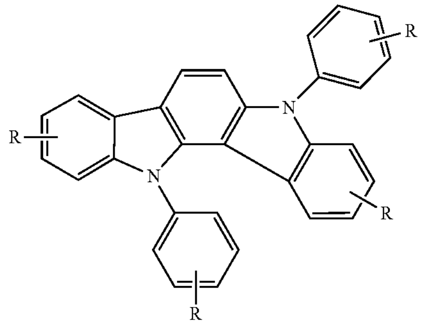
Formula (20)
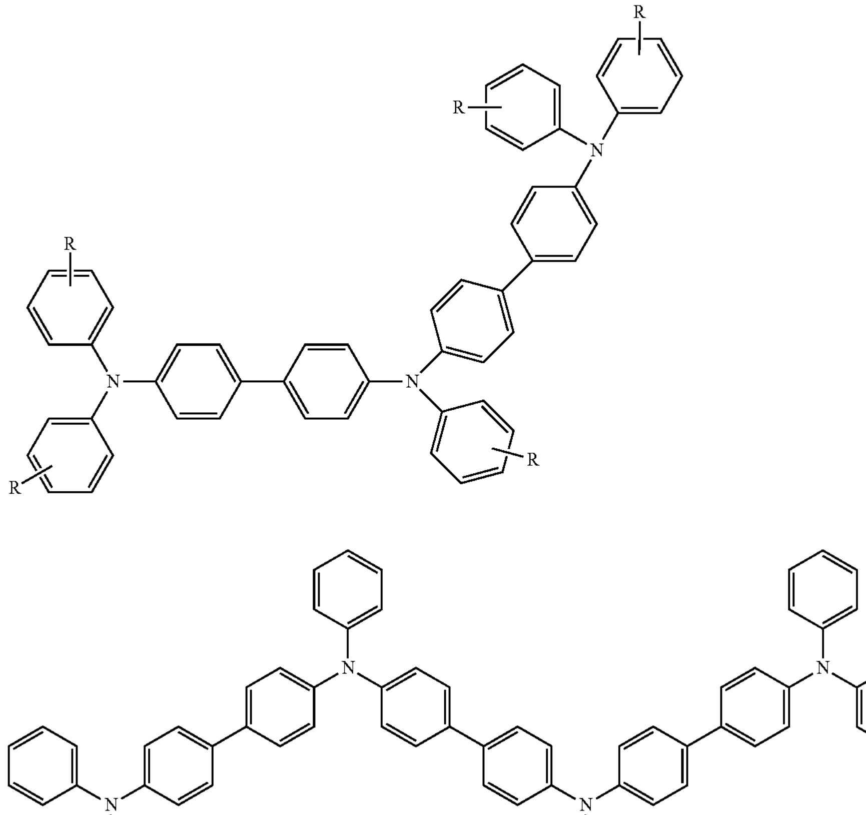
Formula (21)
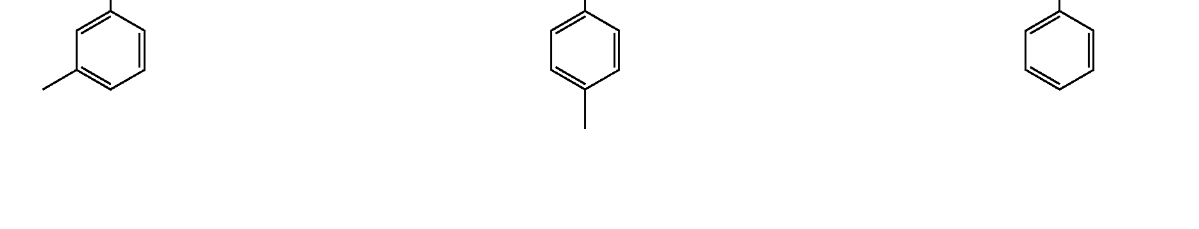

-continued
Formula (22)
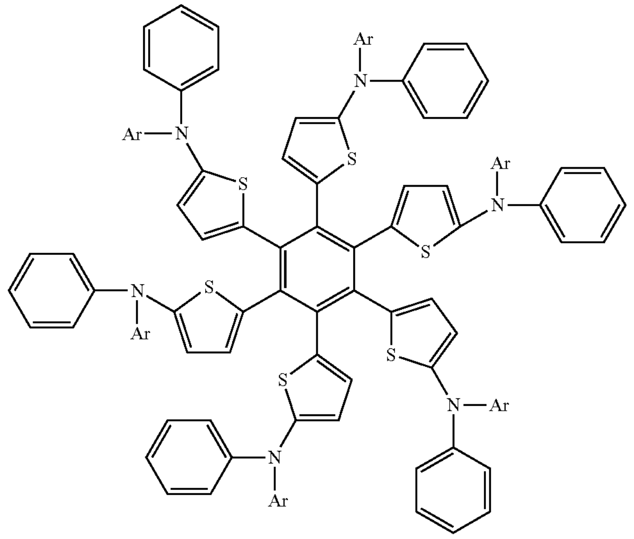
Formula (23)
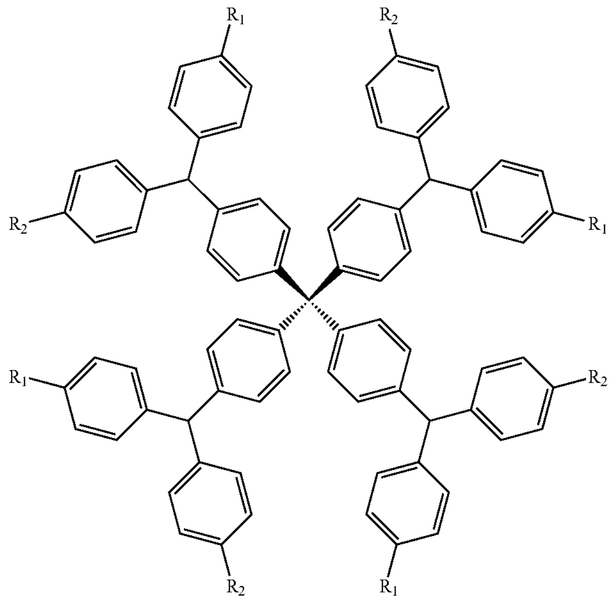
Formula (24)
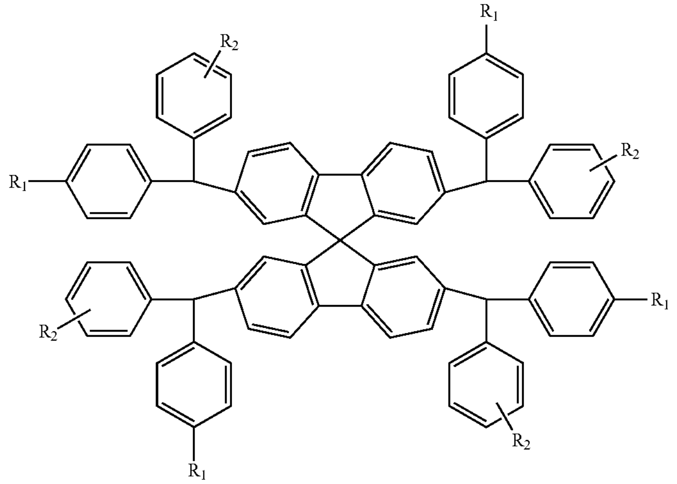

wherein each R, $R_1$, and $R_2$ substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; R' is alkyl; n is an integer from 1 to 6; and Ar is independently selected from aryl, heteroaryl, substituted aryl, and substituted heteroaryl.

The amorphous molecular material may have a molecular weight of about 200 to about 10,000, including from about 250 to about 5000. This is much lower than the molecular weight (Mw) of typical polymeric materials. It should be noted that the molecular weight of a polymeric material is the average value for polymer chains of different lengths, whereas for molecular glasses, all molecules have the same molecular weight. Thus, the molecular weight here is for the molecule itself, and polymeric concepts such as weight-average molecular weight and number-average molecular weight do not apply to molecular glasses.

In embodiments, the molecular glass may have a glass transition temperature from about room temperature (25 degrees C.) to about 350 degrees C., including from about 50 to about 200 degrees C. After crosslinking, the molecular glass network may or may not have a glass transition temperature. In embodiments, the molecular glass has a dielectric constant of less than 4.0, including a dielectric constant less than 3.5.

In some embodiments, the amorphous molecular materials are not crosslinked. In other embodiments, the amorphous molecular materials are crosslinked to offer a more robust layer. The functional groups disclosed above (such as —OH, —$NH_2$, —$OCH_3$, —$OC_2H_5$, —$OCOOC_4H_9$, —CNO, —NHCOOR', —$C_6H_4OH$ (hydroxyphenyl), —COOH, methoxyphenyl, butoxycarbonyloxybenzyl, and an epoxy group) allow the amorphous molecular material to be crosslinked, photochemically or using crosslinking agents, in the semiconducting layer to form a matrix. The amorphous molecular material can be crosslinked by itself or crosslinked with another amorphous molecular material to form network or matrix of the semiconducting layer. The matrix may also comprise a crosslinking agent which is crosslinked with the amorphous molecular material. Generally speaking, the crosslinking agent has at least two crosslinking groups, such as amino, hydroxyl, alkoxy, etc., which are capable of reacting with the functional groups on the amorphous molecular material to form a crosslinked network or matrix comprising the crosslinking agent or part of the crosslinking agent. Exemplary crosslinking agents include a melamine-formaldehyde resin, a phenol-formaldehyde resin, and 1,3,4,6-tetrakis(methoxylmethyl)glycoluril. An idealized melamine-formaldehyde resin is shown as Formula (A) and 1,3,4,6-tetrakis(methoxylmethyl)glycoluril is shown as Formula (B). Other crosslinking agents, such as compounds comprising at least two isocyanate groups, amine groups, carboxylic acid groups, and the like, can be used.

Formula (A)

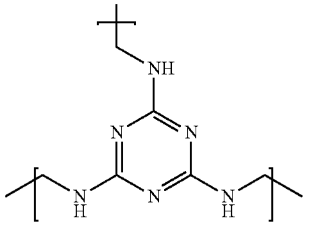

Formula (B)

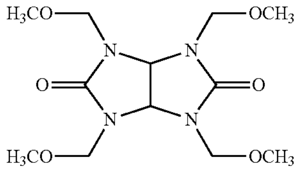

Generally, the molar ratio of amorphous molecular material to crosslinking agent is calculated so that all of the crosslinking groups in the amorphous molecular material and the crosslinking agents are reacted, to obtain as high a crosslinking density as possible. For example, if the amorphous molecular material has four hydroxyl groups and the crosslinking agent has four crosslinking groups, then the molar ratio of amorphous molecular material to crosslinking agent may be 1:1. As another example, if the amorphous molecular material has four hydroxyl groups and the crosslinking agent has three crosslinking groups, then the molar ratio of amorphous molecular material to crosslinking agent may be 3:4.

The semiconducting composition also comprises a non-amorphous semiconductor material. In the semiconducting layer, the semiconductor material is dispersed within/throughout the amorphous film formed by the molecular glass. Any suitable semiconductor material can be used in the semiconducting composition. In embodiments, the non-amorphous semiconductor material is a crystalline, semicrystalline, or liquid crystalline semiconductor. In further embodiments, the semiconductor material is a highly crystalline molecular semiconductor. Preferred materials include high mobility small molecule semiconductors. In some embodiments, the semiconducting composition consists of the molecular glass and the non-amorphous semiconductor material.

In some embodiments, the semiconductor material may be a bis(ethynyl)heteroacene of Formula (I):

Formula (Ia)

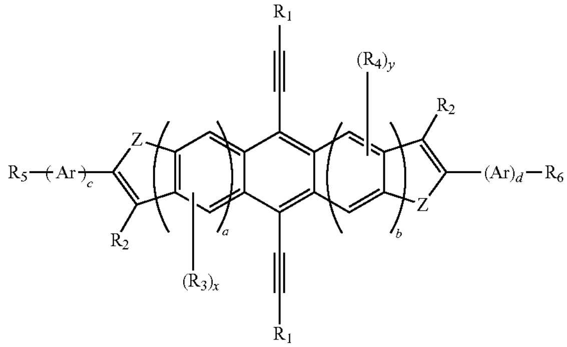

-continued

Formula (Ib)

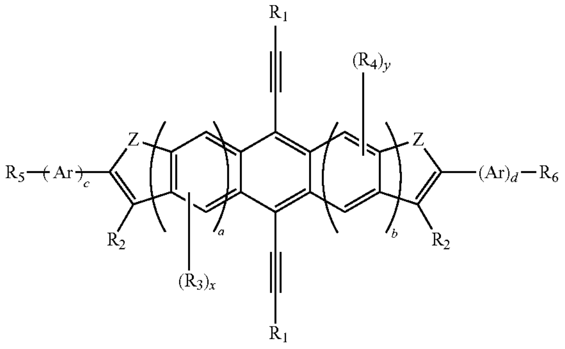

wherein $R_1$ and $R_2$ are independently selected from hydrogen, alkyl, aryl, alkoxy, substituted alkyl, substituted aryl, substituted alkoxy, trialkylsilyl, cyano, nitro, or a halogen;

$R_3$ and $R_4$ are independently selected from alkyl, aryl, alkoxy, substituted alkyl, substituted aryl, substituted alkoxy, hydrogen, trialkylsilyl, cyano, nitro, or a halogen;

$R_5$ and $R_6$ are independently selected from hydrogen, halogen, cyano, nitro, alkyl, aryl, alkoxy, substituted alkyl, substituted aryl, substituted alkoxy, or trialkylsilyl;

Ar is independently selected from aryl, heteroaryl, substituted aryl, and substituted heteroaryl;

Z represents —CH═CH—, sulfur, oxygen, selenium, or NR, wherein R is hydrogen or a hydrocarbon such as alkyl or aryl; and x, y, a, b, c, and d are integers representing the number of sidechains, rings, or aromatic groups.

In some embodiments, Z is selected so that the two ends of the central moiety are five-membered rings, i.e. Z is not —CH═CH—. The variables x and y may be independently from 0 to about 6, or 0 to about 2. The sum of x and y may be from 0 to about 12, 0 to about 6, or 0 to about 4. The variables c and d may be independently from 0 to about 4. The variables a and b may be independently from 0 to about 3. In particular embodiments, both a and b are at least 1, or are 1.

Each Ar may be selected from the group consisting of:

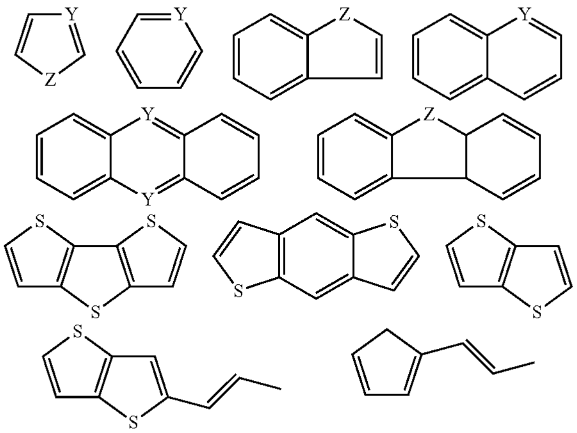

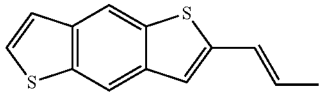

and

-continued

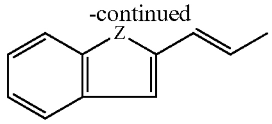

wherein Z is C(R'R"), O, S, Se, NR'", or Si(R'R"), and wherein R', R", and R'" are independently hydrogen, alkyl, or aryl; and Y is a carbon atom or a nitrogen atom.

In embodiments, the bis(ethynyl)heteroacene is represented by one of the following formulas:

Formula (25a)

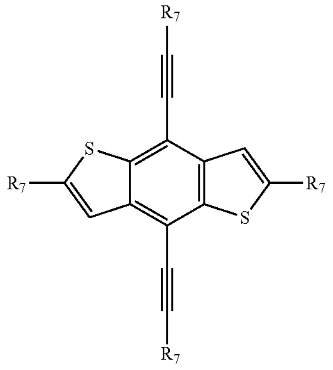

Formula (25b)

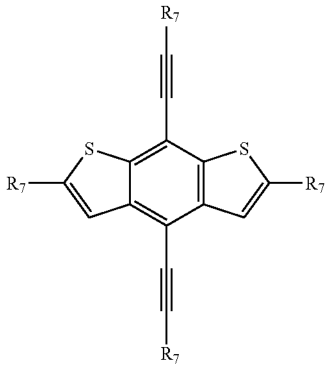

Formula (26a)

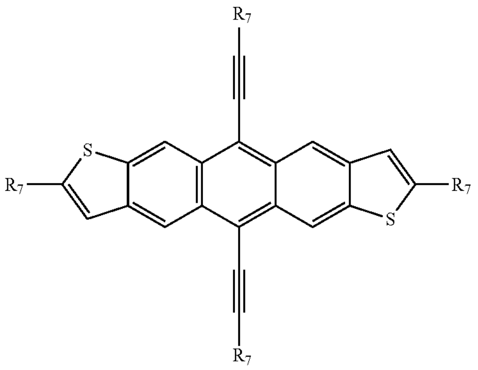

-continued
Formula (26b)
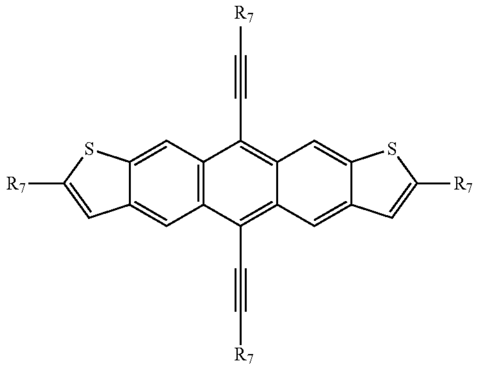
Formula (27a)
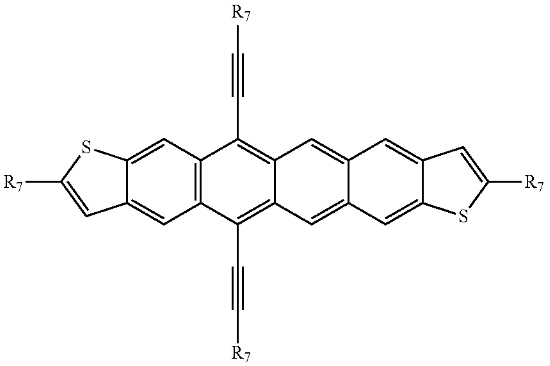
Formula (27b)
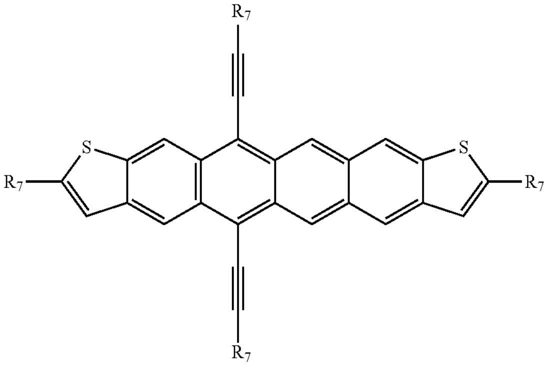
Formula (28a)
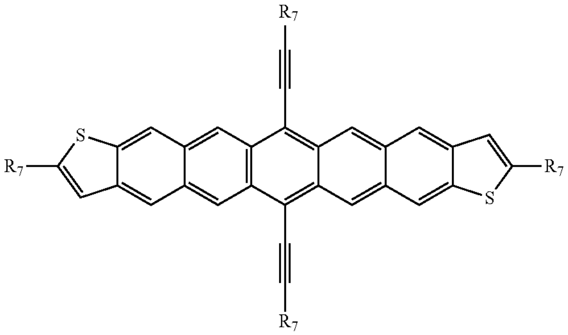
-continued
Formula (28b)
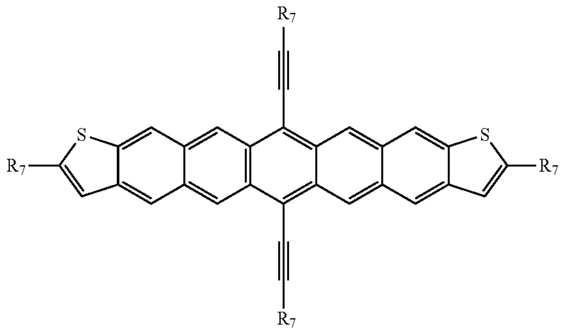
Formula (29a)
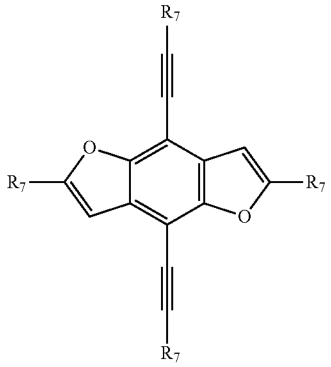
Formula (29b)
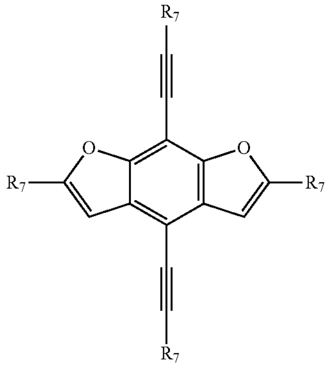
Formula (30a)
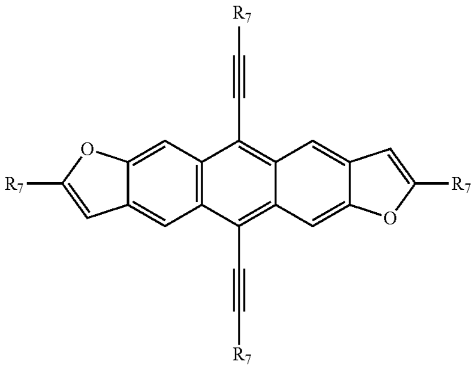

-continued
Formula (30b)
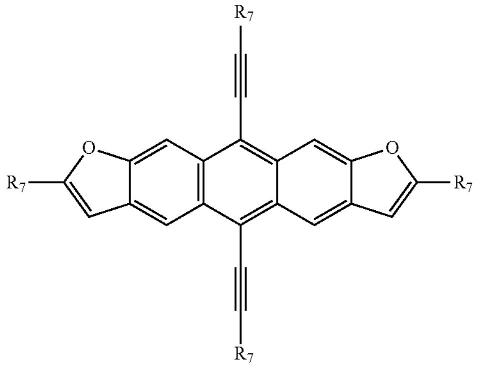
Formula (31a)
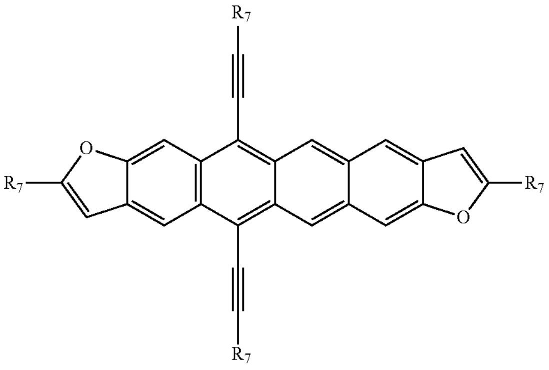
Formula (31b)
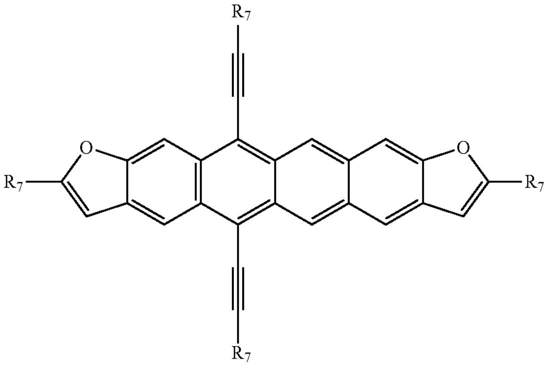
Formula (32a)
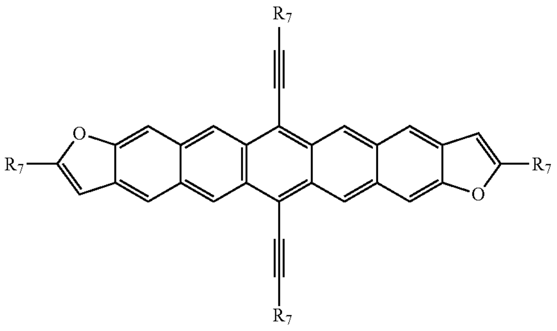
-continued
Formula (32b)
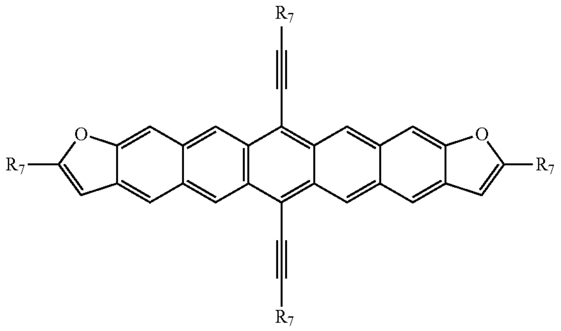
Formula (33a)
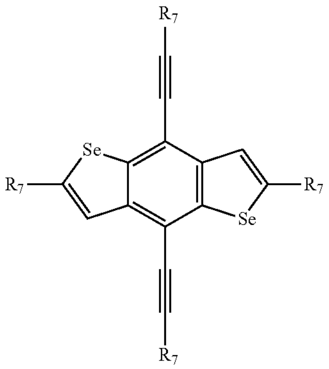
Formula (33b)
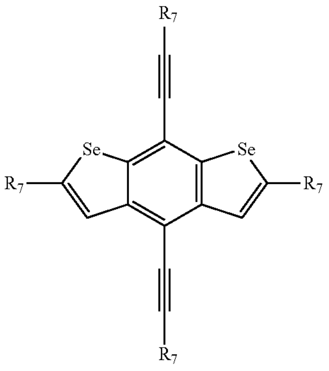
Formula (34a)
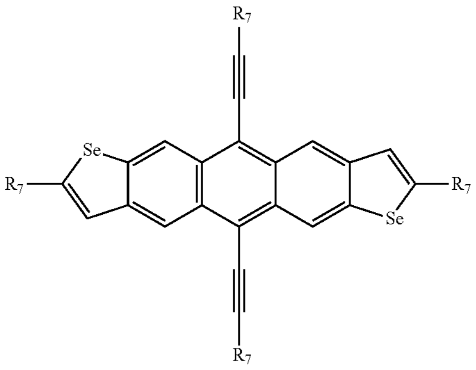

-continued
Formula (34b)
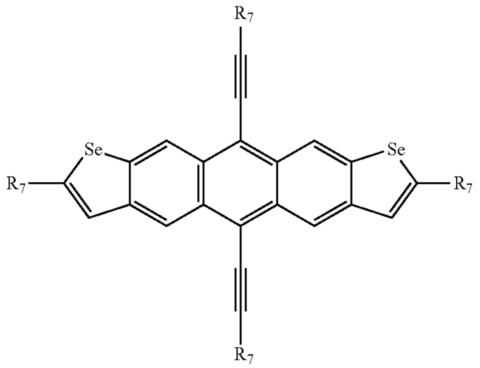
Formula (35a)
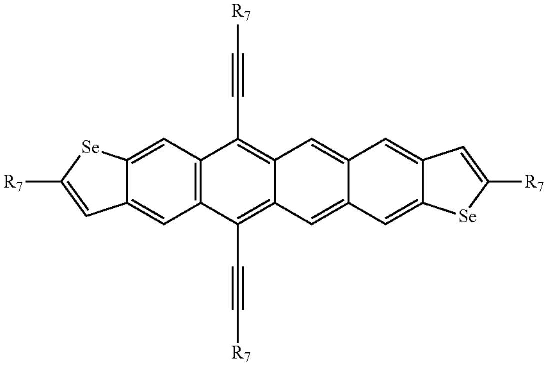
Formula (35b)
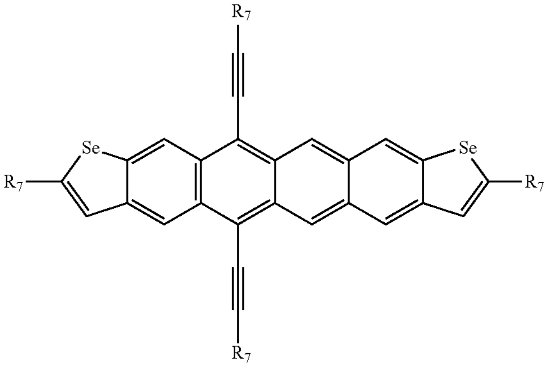
Formula (36a)
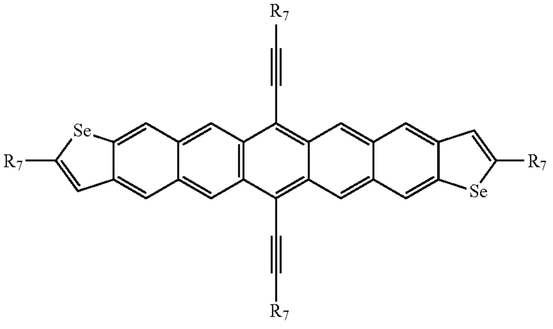
-continued
Formula (36b)
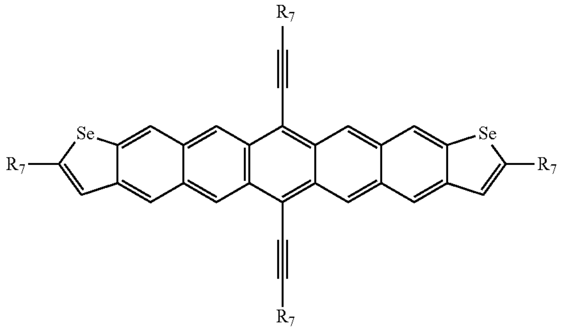
Formula (37a)
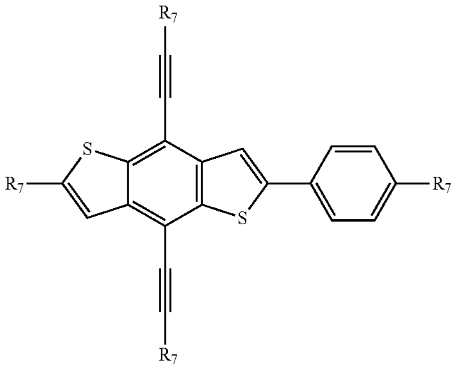
Formula (37b)
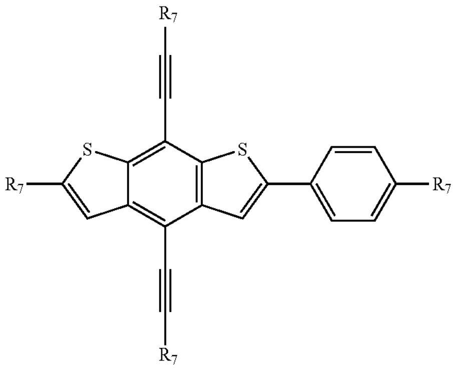
Formula (38a)
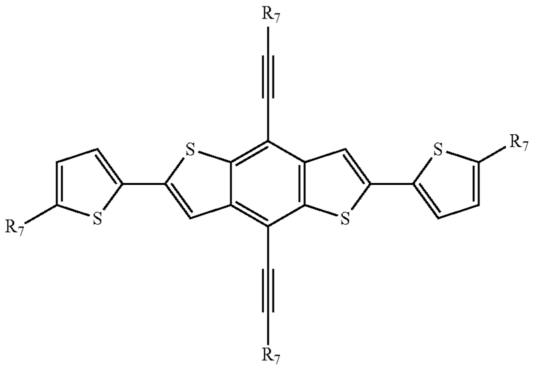

-continued

Formula (38b)

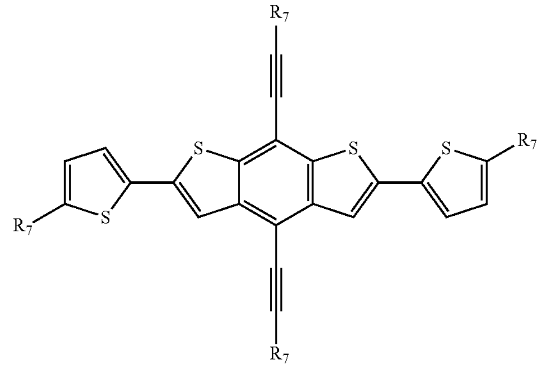

Formula (39a)

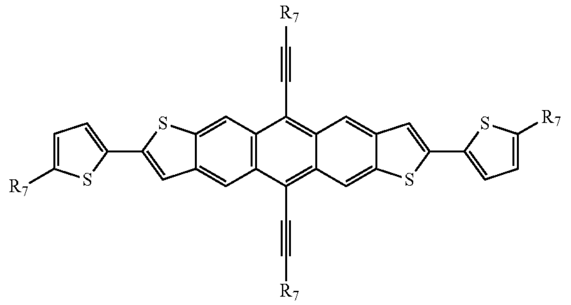

Formula (39b)

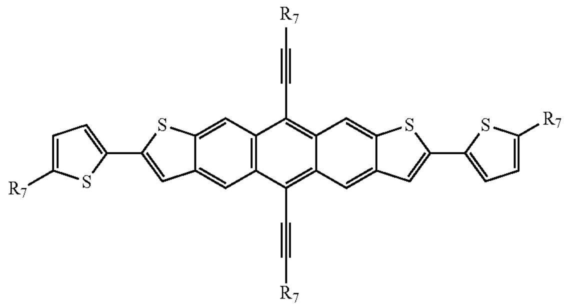

Formula (40a)

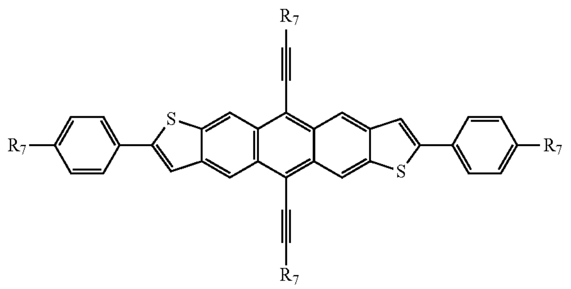

-continued

Formula (40b)

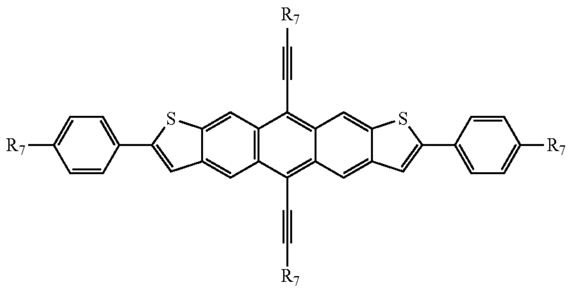

Formula (41)

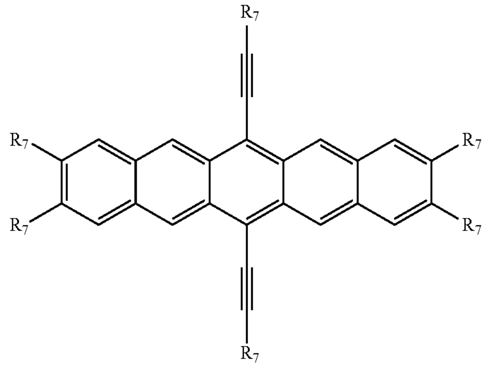

wherein $R_7$ is alkyl, phenyl substituted with one alkyl chain, or trialkylsilyl. Exemplary alkyl chains have 3 to 18 carbon atoms. The alkyl chain on the phenyl group may have 3 to 18 carbon atoms as well. The three alkyl chains on the silyl group can each have 1 to 12 carbon atoms, and the three chains are the same.

The $R_1$, $R_2$, $R_3$, $R_4$, $R_5$, $R_6$, and $R_7$ groups for the bis(ethynyl)heteroacene may be independently hydrogen, alkyl, alkoxy, aryl, or halogen. The alkyl chains may have from about 1 to about 25, including from about 4 to about 18 carbon atoms and from about 6 to about 16 carbon atoms. This includes the linear forms and the isomeric forms of these alkyl chains. The alkoxy chains may have from about 1 to about 30 carbon atoms, including from about 2 to about 18 carbon atoms. The aryl groups include aromatic rings having from about 6 to about 48 carbon atoms, including from about 6 to about 36 carbon atoms or from about 12 to about 24 carbon atoms. It should be noted that these ranges of carbon atoms refer to the number of carbon atoms in the aromatic rings themselves, and should not be interpreted as including sidechains. For example, a methylphenyl group has 7 carbon atoms, but is not considered an aryl group. The term "halogen" refers to chloride, bromide, fluoride, and iodide.

The bis(ethynyl)heteroacenes in embodiments are soluble or substantially soluble in common coating solvents, for example, in embodiments they possess a solubility of at least about 0.1 percent to about 95 percent by weight, and more specifically, from about 0.5 percent to about 5 percent by weight in such solvents as methylene chloride, 1,2-dichloroethane, tetrahydrofuran, toluene, xylene, mesitylene, chlorobenzene, dichlorobenzene, and the like. Moreover, the poly[bis(ethynyl)heteroacene]s of the present disclosure in embodiments, when fabricated as semiconductor channel layers in TFT devices, provide a stable conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

In other embodiments, the semiconductor material is selected from Formulas (42)-(45):

Formula (42)

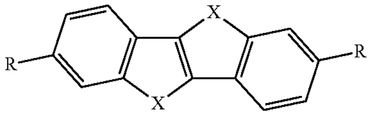

Formula (43a)

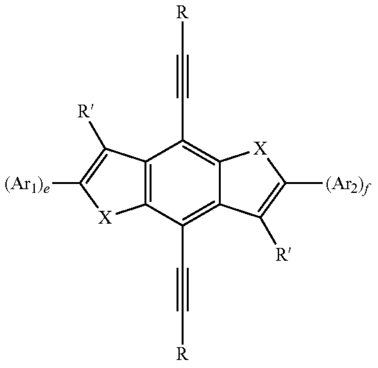

Formula (43b)

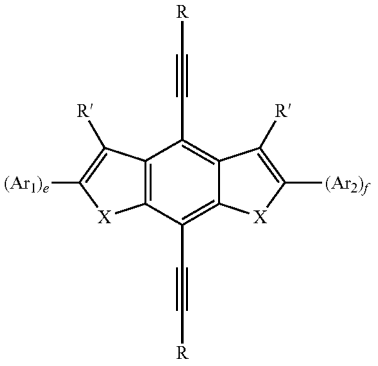

Formula (44a)

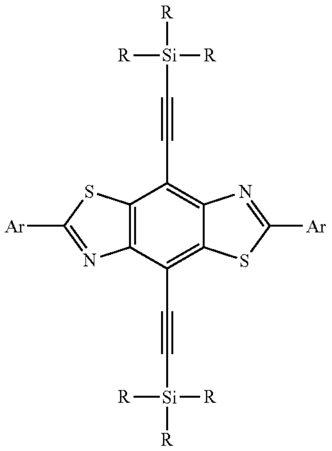

-continued

Formula (44b)

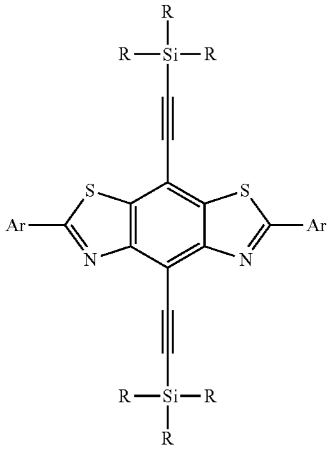

Formula (45)

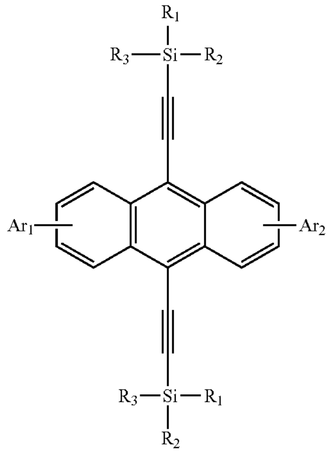

wherein R, R', $R_1$, $R_2$, and $R_3$ are independently selected from the group consisting of alkyl, perfluoroalkyl, aryl, alkoxy, and trialkysilyl; X is O, S, Se, or —NH; e and f are independently from 0 to about 4; and $Ar_1$ and $Ar_2$ are independently selected from the group consisting of

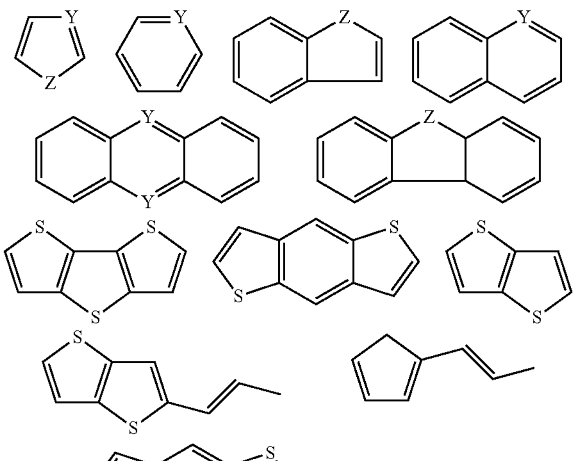

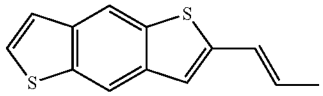

and

-continued

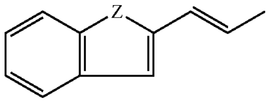

wherein Z is selected from the group consisting of C(R'R"), O, S, Se, NR", and Si(R'R"), wherein R', R", and R'" are independently selected from the group consisting of hydrogen, alkyl, or aryl; and Y is a carbon atom or a nitrogen atom.

Specific examples of non-amorphous semiconductor materials include those represented by Formulas (46) and (47):

Formula (46)

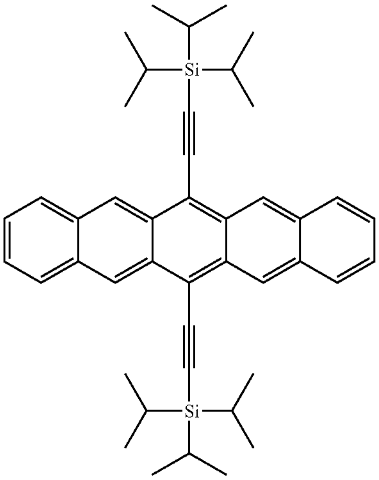

Formula (47a)

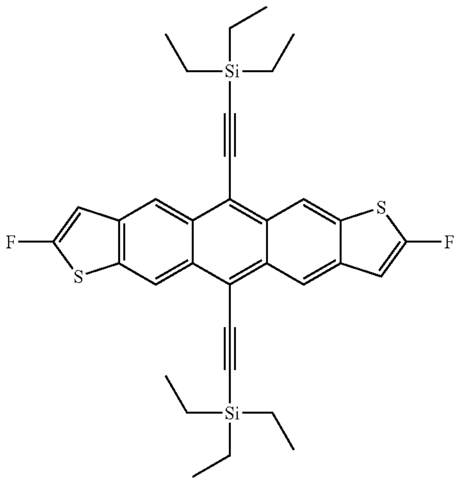

-continued

Formula (47b)

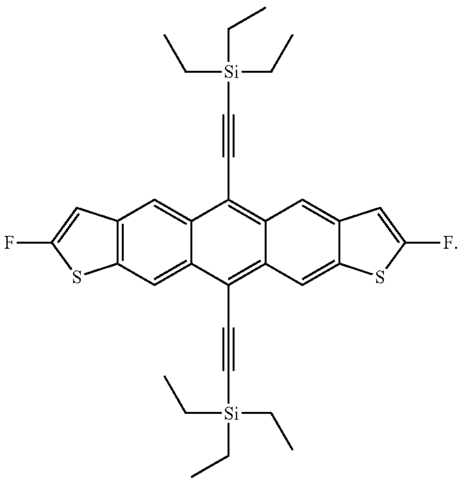

In embodiments, the molecular glass may comprise from about 1 to about 60 weight percent of the semiconducting layer, including about 10 to about 50 weight percent of the semiconductor layer. The semiconductor material may comprise from about 40 to about 99 weight percent of the semiconducting layer, including about 50 to about 90 weight percent of the semiconducting layer. In specific embodiments, the weight ratio of molecular glass to the non-amorphous semiconductor material is about 1:1.

The semiconducting layer is from about 5 nanometers to about 1000 nanometers deep, including from about 20 to about 100 nanometers in depth. In certain configurations, such as the configurations shown in FIGS. 1 and 4, the semiconducting layer completely covers the source and drain electrodes.

The semiconducting layer may be formed using conventional processes known in the art. In embodiments, the semiconducting layer is formed using liquid depositing techniques. Any suitable liquid depositing technique may be employed. Exemplary liquid depositing techniques include blanket coating such as spin coating, blade coating, rod coating, dip coating, and the like, and printing such as screen printing, ink jet printing, stamping, stencil printing, screen printing, gravure printing, flexography printing, and the like.

In particular, the liquid composition used to form the semiconducting layer may comprise the amorphous molecular material, the semiconductor material, an optional crosslinking agent, and an optional catalyst. The optional catalyst may be an acid. Exemplary acid catalysts include toluene sulfonic acid (TSA). When a photoacid generator, i.e. a compound that generates acid upon light irradiation, is used as the acid catalyst, the semiconducting layer can be patterned into the desired structure. Exemplary photoacid generators may include bis(4-tert-butylphenyl)iodonium perfluoro-1-butanesulfonate, bis(4-tert-butylphenyl)iodonium p-toluenesulfonate, boc-methoxyphenyldiphenylsulfonium triflate, diphenyliodonium 9,10-dimethoxyanthrancene-2-sulfonate, diphenyliodonium p-toluenesulfonate, diphenyliodonium triflate, N-hydronaphthalimide triflate, (4-iodophenyl)diphenylsulfonium triflate, (4-methylphenyl)diphenylsulfonium triflate, tris(4-tert-butylphenyl)sulfonium triflate, triarylsulfonium hexafluorophosphate salts, and the like. The optional catalyst may also be a base. Exemplary base catalysts include organoamines such as triethylamine, phosphanes, carbonyl, nitrosyl, N-heterocyclic carbine ligands, imidazolidinone and pyrrolidine derivatives, and the like.

Exemplary solvents used in the solution may include alcohols such as propanol, butanol, hexanol, heptenol, octanol, nonanol, decanol, undecanol, dodecanol, tetradecanol, and hexadecanol; a diol such as hexanediol, heptanediol, octanediol, nonanediol, and decanediol; an alcohol comprising an unsaturated double bond, such as farnesol, dedecadienol, linalool, geraniol, nerol, heptadienol, tetradecenol, hexadeceneol, phytol, oleyl alcohol, dedecenol, decenol, undecylenyl alcohol, nonenol, citronellol, octenol, and heptenol; a cycloaliphatic alcohol with or without an unsaturated double bond, such as methylcyclohexanol, menthol, dimethylcyclohexanol, methylcyclohexenol, terpineol, dihydrocarveol, isopulegol, cresol, trimethylcyclohexenol; and the like; and mixtures and isomers thereof; hydrocarbons or aromatic hydrocarbons such as hexane, heptane, toluene, xylene, mesitylene, trimethyl benzene, ethyl benzene, and the like, chlorinated solvents such as chlorobenzene, chlorotoluene, dichlorobenzene, dichloroethane, and the like; ketones such as acetone, methyl ethyl ketone, methy isobutyl ketone, and the like; acetates, such as propylene glycol monoethyl ether acetate, ethyl acetate, and the like; pyridine, tetrahydrofuran, and the like. The molecular glass may have a concentration of from about 2 percent by weight to about 60 percent by weight, including from about 5 percent by weight to about 30 percent by weight, or from about 8 percent by weight to about 20 percent by weight in the solution. The liquid composition may have a viscosity of for example from about 2 cps to about 1000 cps, including from about 5 cps to about 500 cps. In further embodiment, the liquid composition is inkjettable, having a viscosity from about 2 cps to about 20 cps including from about 5 cps to 12 cps. In embodiments, the liquid composition is a Newtonian fluid. In other embodiments, the liquid composition is a non-Newtonian fluid. The liquid composition has a surface tension for suitable coating and printing techniques. For example, in some embodiments, the liquid composition has a surface tension of from about 22 mN/m to about 38 mN/m, including from about 25 mN/m to about 32 mN/m.

A thin film transistor generally includes a substrate, an optional gate electrode, source electrode, drain electrode, and a dielectric layer in addition to the semiconducting layer.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconductor layer are on the substrate, even though one layer is closer to the substrate than the other layer. The resulting TFT has good mobility and good current on/off ratio.

While particular embodiments have been described, alternatives, modifications, variations, improvements, and substantial equivalents that are or may be presently unforeseen may arise to applicants or other skilled in the art. Accordingly, the appended claims as filed and as they are amended are intended to embrace all such alternatives, modifications, variations, improvements, and substantial equivalents.

What is claimed is:

1. A semiconducting composition comprising a non-amorphous semiconductor material and a molecular glass;

wherein the molecular glass is selected from the group consisting of:

(A) a spiro compound of Formula (1) or Formula (2):

Formula (1)

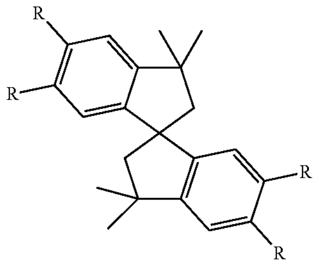

Formula (2)

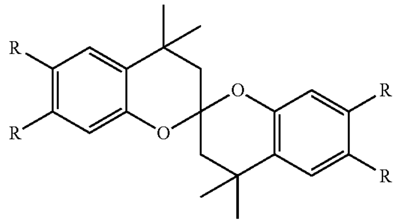

wherein each R substituent is independently selected from the group consisting of hydrogen, alkyl comprising from about 1 to about 18 carbon atoms, aryl or substituted aryl haying from about 3 to about 18 carbon atoms, hydroxyl, protected hydroxyl, amino, protected amino, —OR', —OCOOR', —CNO, —NHCOOR', hydroxyphenyl, —COOH, and epoxy, and R' is alkyl;

(B) a structure selected from one of Formula (3) to Formula (8):

Formula (3)

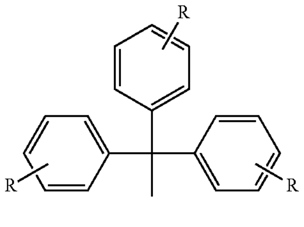

-continued

Formula (4)

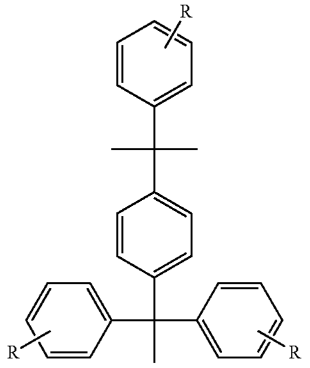

Formula (5)

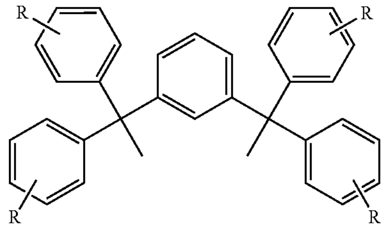

Formula (6)

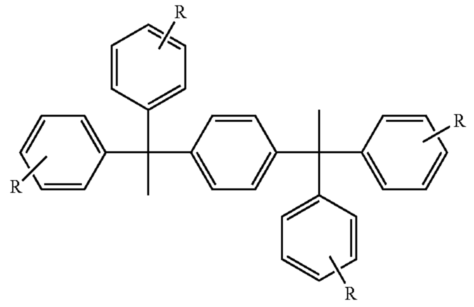

Formula (7)

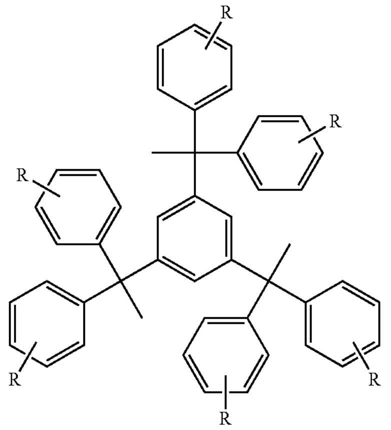

(Formula (8)

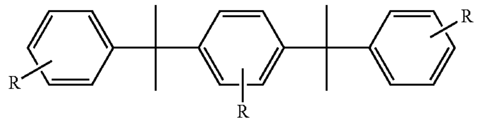

wherein each R is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy, and R' is alkyl;

(C) a silane of Formula (9):

Formula (9)

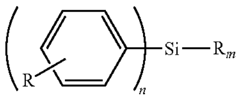

wherein each R is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy: R' is alkyl; and m and n are both integers, wherein m+n=4:

(D) an adamantane derivative of Formula (10):

Formula (10)

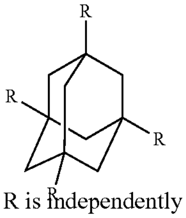

wherein each R is independently a substituent comprising a heteroatom;

(E) a structure selected from one of Formula (11) to Formula (13):

Formula (11)

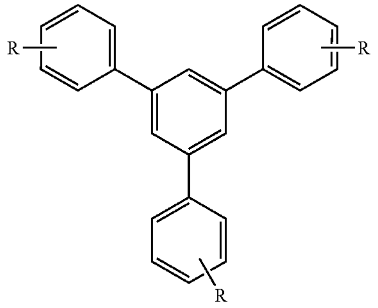

Formula (12)

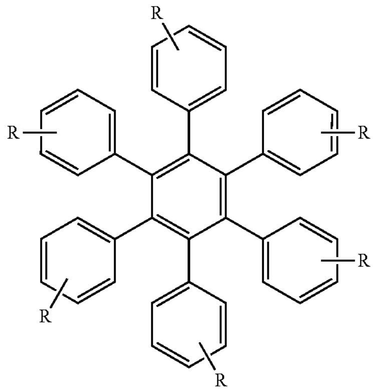

-continued

Formula (13)

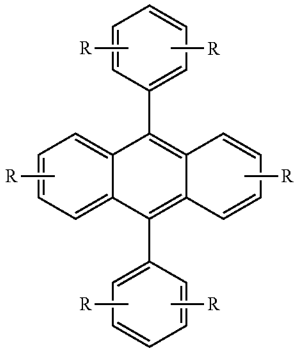

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; and R' is alkyl;

(F) a calixarene derivative of Formula (14):

Formula (14)

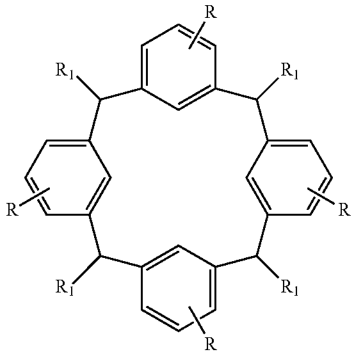

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH and epoxy; R' alkyl; and each $R_1$ is a phenyl group substituted with an oxygen-containing radical; and (G) an arylamine derivative selected from one of Formula (16)-(24):

Formula (16)

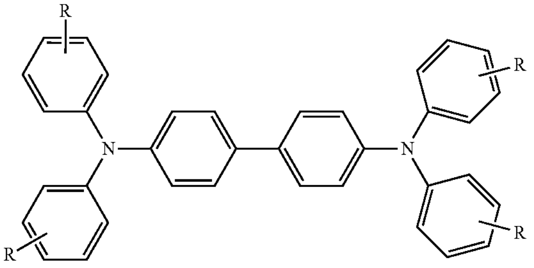

-continued
Formula (17)
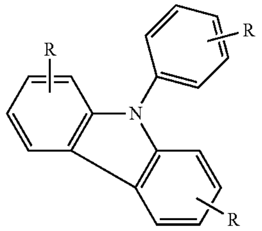
Formula (18)
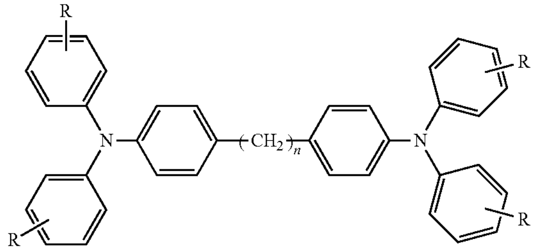
Formula (19)
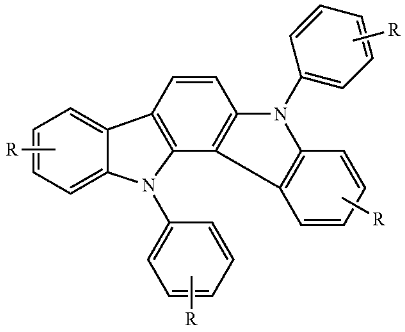
Formula (20)
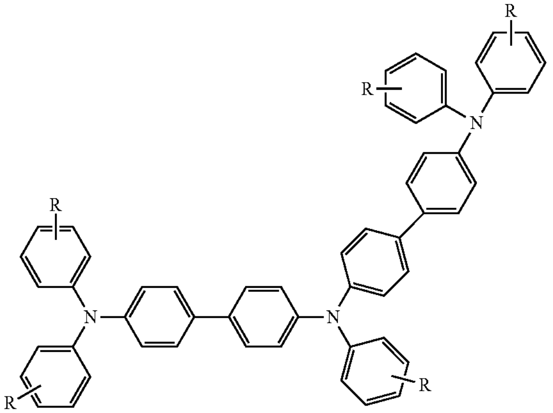
Formula (21)
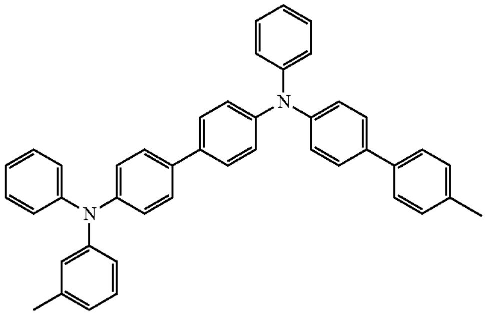
-continued
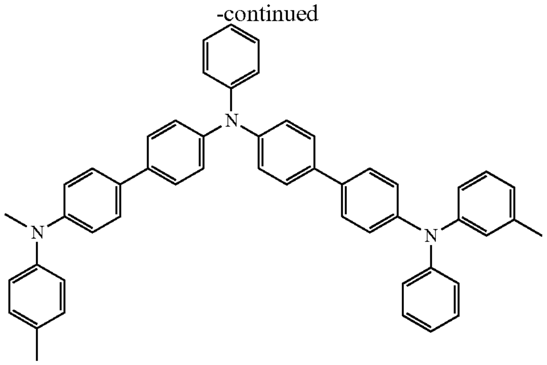
Formula (22)
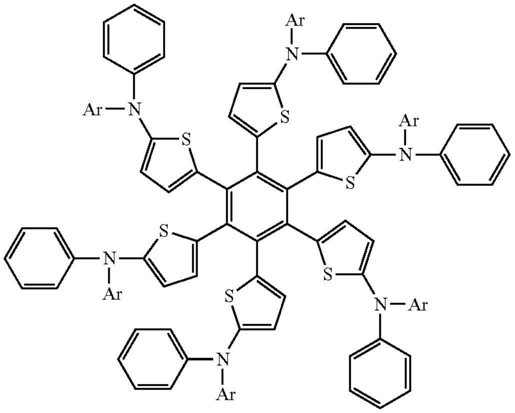
Formula (23)
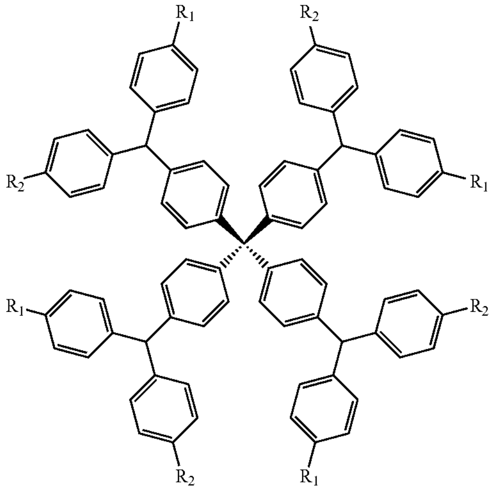
Formula (24)
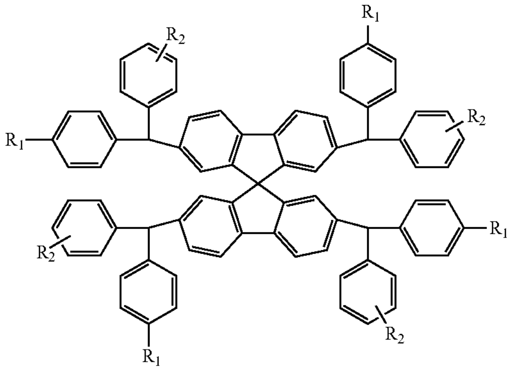

wherein each R, $R_1$, and $R_2$ substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COON, and epoxy; R' is alkyl; n is an integer from 1 to 6; and Ar is independently selected from aryl, heteroaryl, substituted aryl, and substituted heteroaryl.

2. The semiconducting composition of claim 1, wherein individual molecules of the molecular glass are crosslinked with different molecules of the molecular glass or with molecules of a different amorphous molecular material.

3. The semiconducting composition of claim 1, wherein the non-amorphous semiconductor material is represented by Formula (Ia) or (Ib):

Formula (Ia)

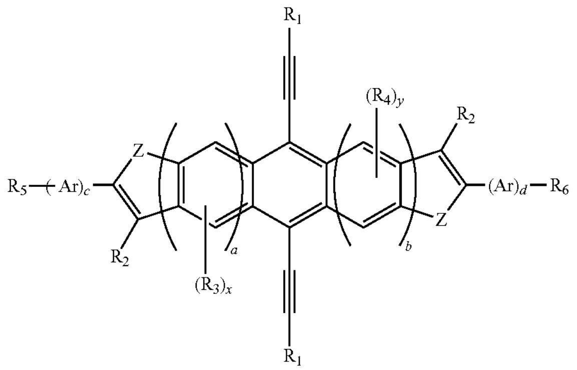

Formula (Ib)

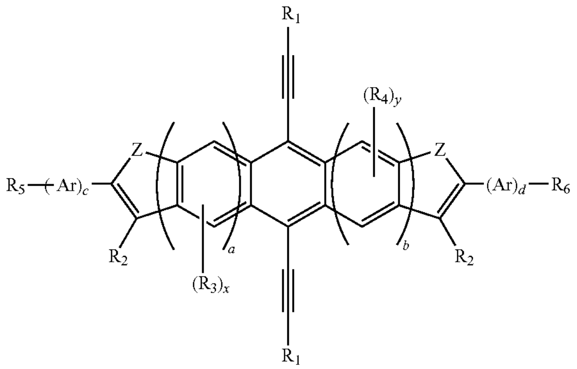

wherein $R_1$ and $R_2$ are independently selected from hydrogen, alkyl, aryl, alkoxy, substituted alkyl, substituted aryl, substituted alkoxy, trialkylsilyl, cyano, nitro, or a halogen; $R_3$ and $R_4$ are independently selected from alkyl, aryl, alkoxy, substituted alkyl, substituted aryl, substituted alkoxy, hydrogen, trialkylsilyl, cyano, nitro, or a halogen; $R_5$ and $R_8$ are independently selected from hydrogen, halogen, cyano, nitro, alkyl, aryl, alkoxy, substituted alkyl, substituted aryl, substituted alkoxy, or trialkylsilyl; Ar is independently selected from aryl, heteroaryl, substituted aryl, and substituted heteroaryl; Z represents —CH═CH—, sulfur, oxygen, selenium, or NR, wherein R is hydrogen or a hydrocarbon such as alkyl or aryl; x and y are independently from 0 to about 6; a and b are independently from 0 to about 3; and c and d are independently from 0 to about 4.

4. The semiconducting composition of claim 1, wherein the non-amorphous semiconductor material is represented by one of Formulas (25)-(41):

Formula (25a)

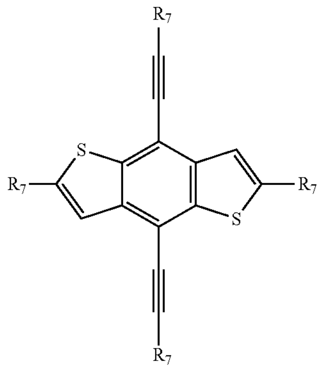

Formula (25b)

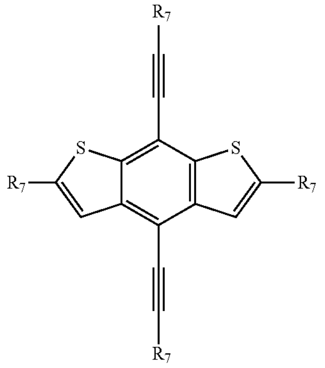

Formula (26a)

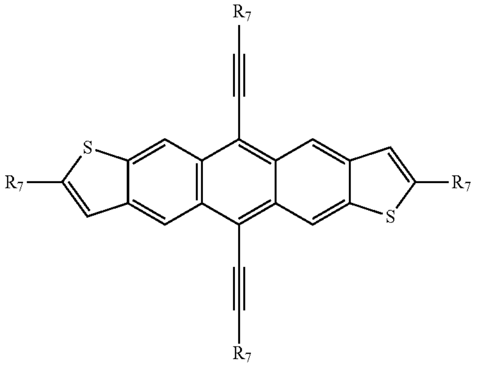

Formula (26b)

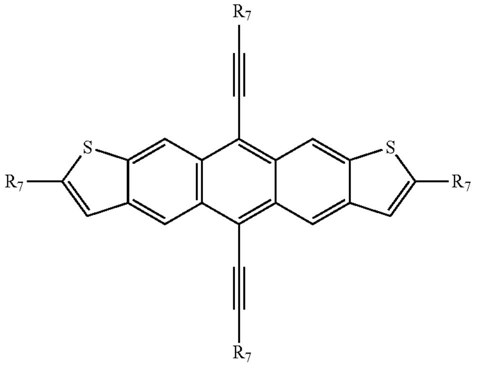

-continued
Formula (27a)
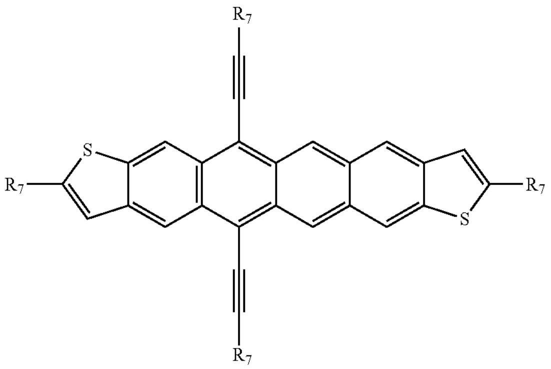
Formula (27b)
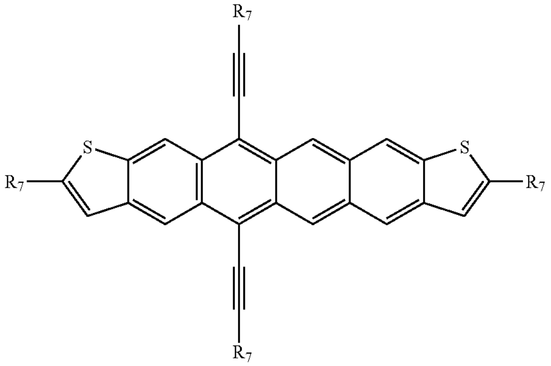
Formula (28a)
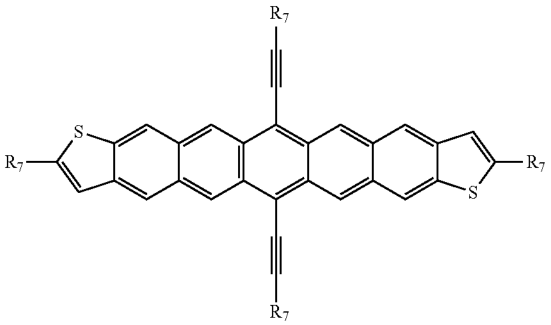
Formula (28b)
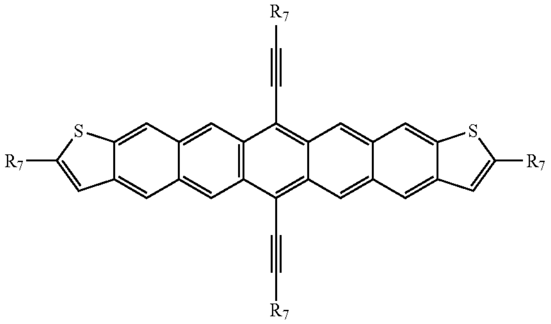
-continued
Formula (29a)
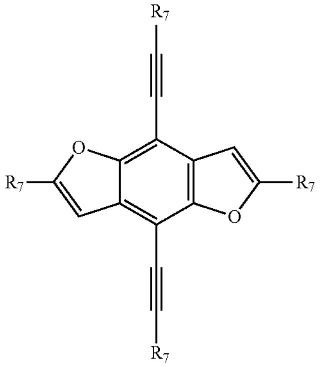
Formula (29b)
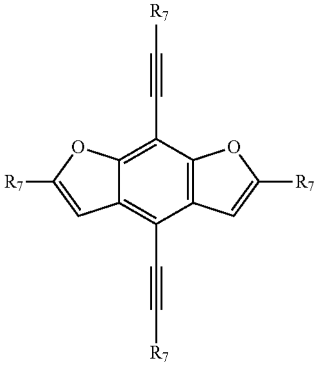
Formula (30a)
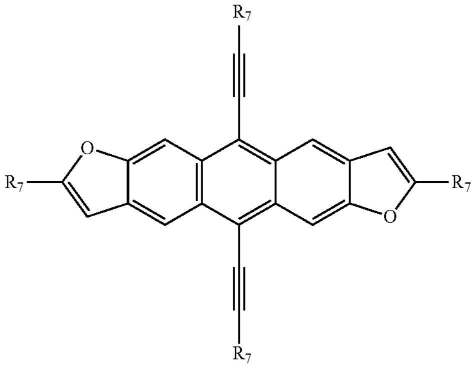
Formula (30b)
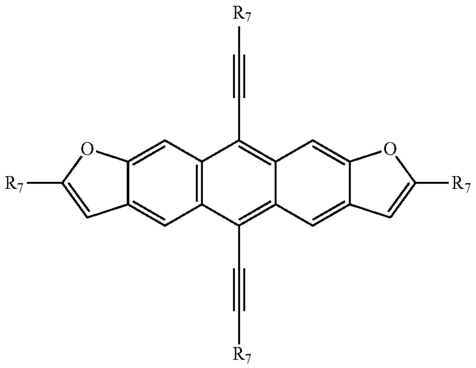

-continued
Formula (31a)
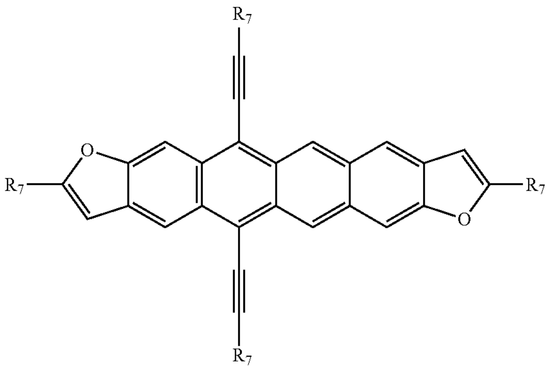
Formula (31b)
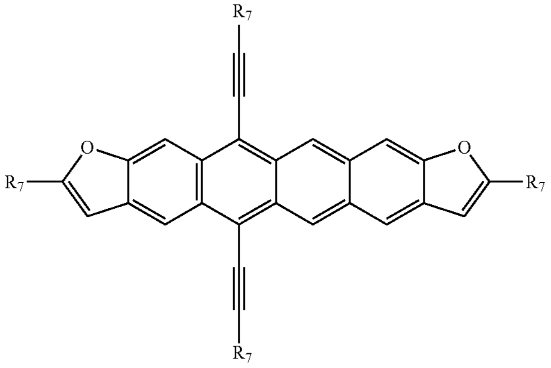
Formula (32a)
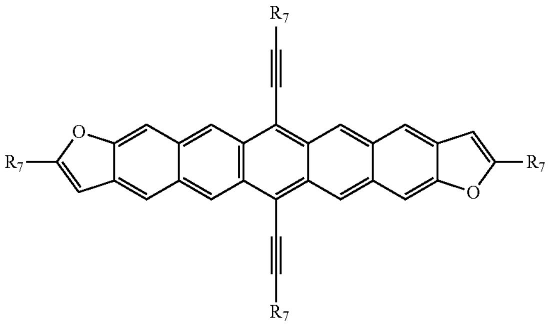
Formula (32b)
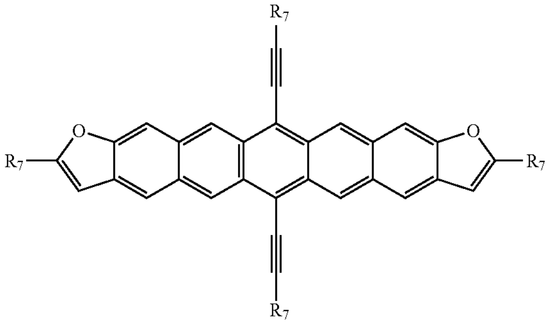
-continued
Formula (33a)
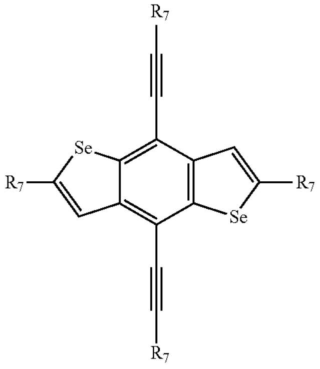
Formula (33b)
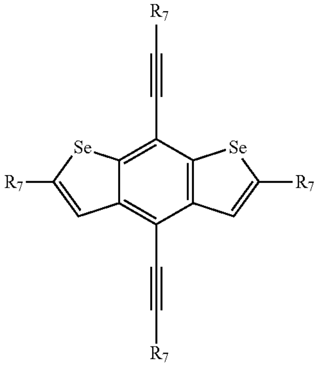
Formula (34a)
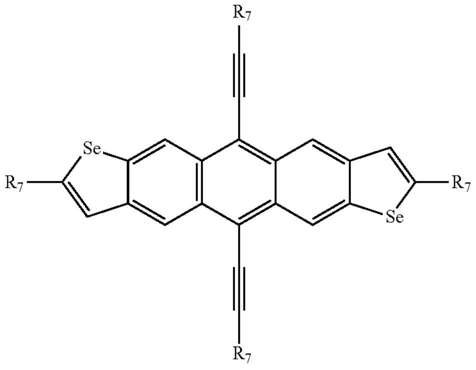
Formula (34b)
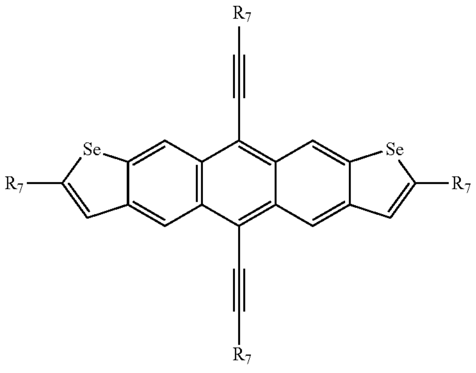

Formula (35a)
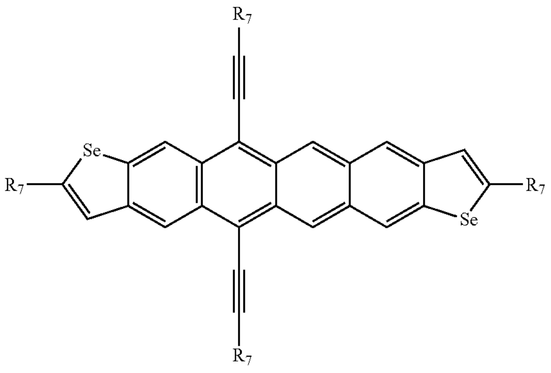
Formula (35b)
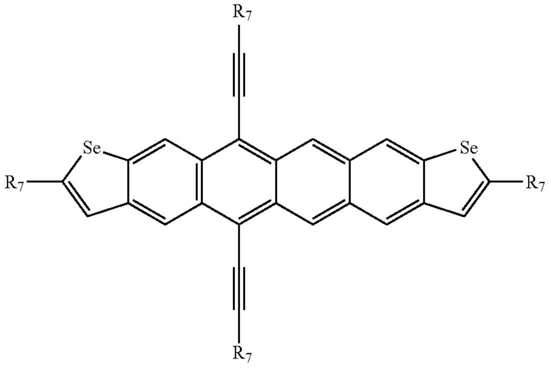
Formula (36a)
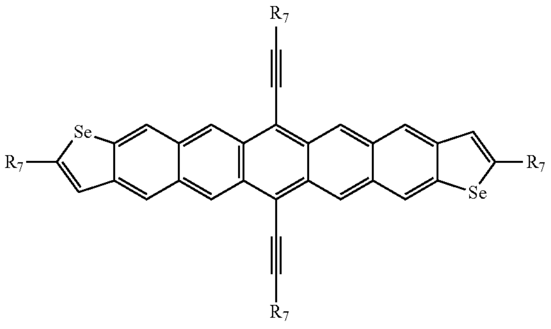
Formula (36b)
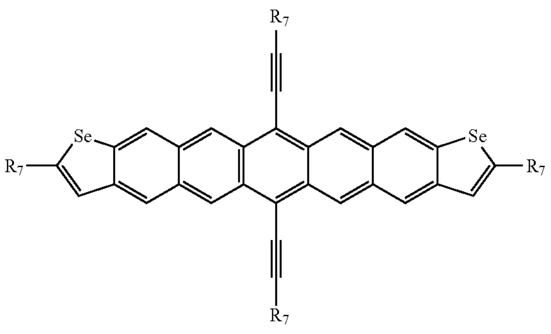
Formula (37a)
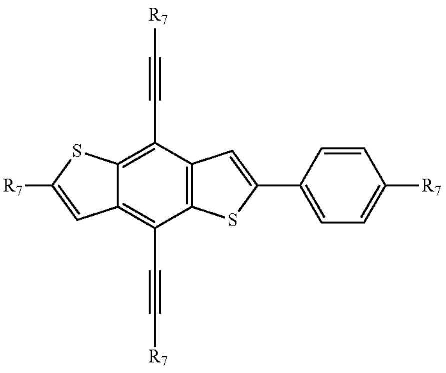
Formula (37b)
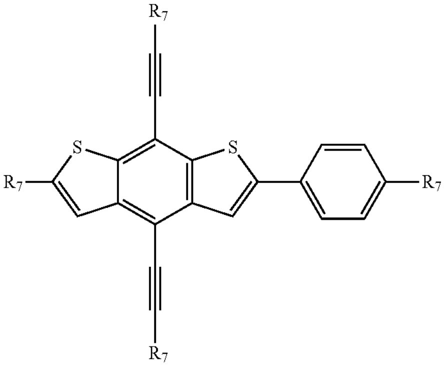
Formula (38a)
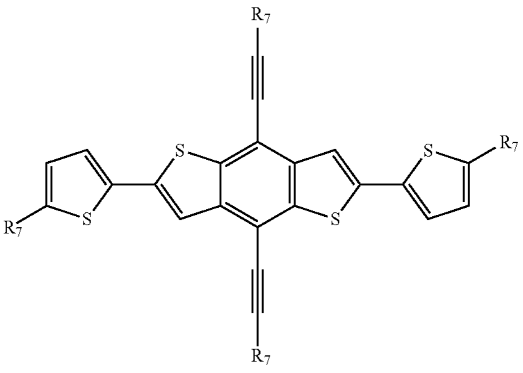
Formula (38b)
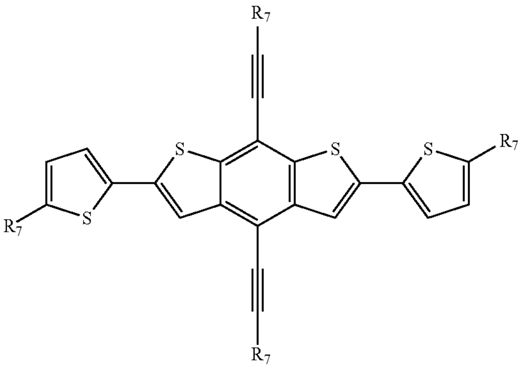

-continued

Formula (39a)

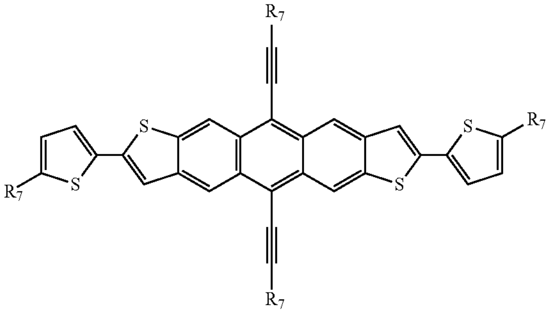

Formula (39b)

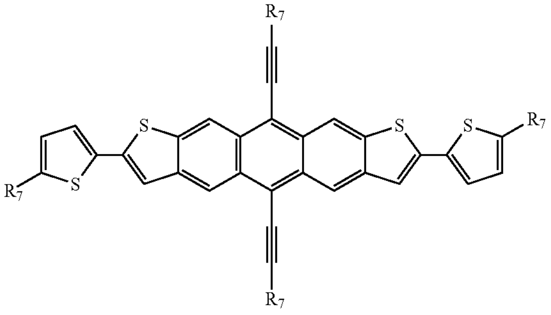

Formula (40a)

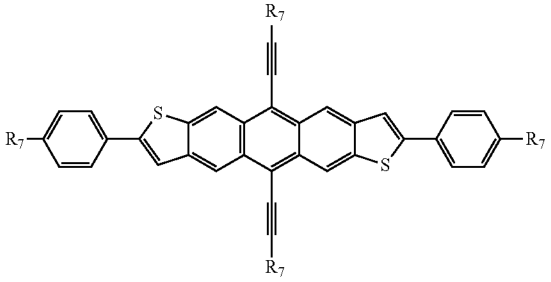

Formula (40b)

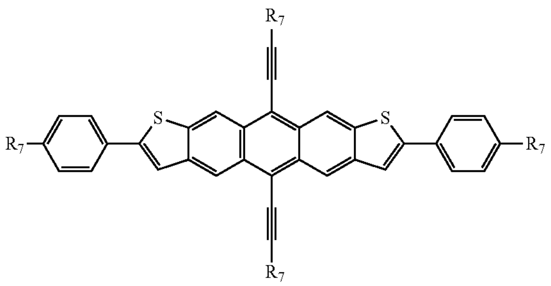

-continued

Formula (41)

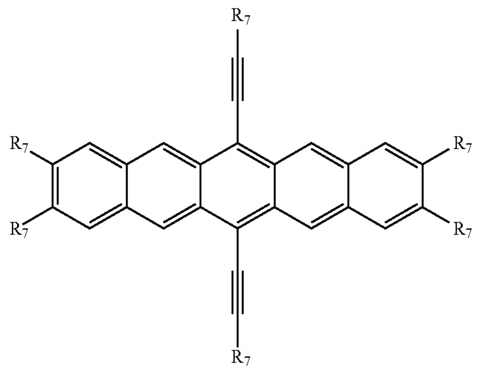

wherein $R_7$ is independently selected from the group consisting of hydrogen, halogen, alkyl, phenyl substituted with one alkyl chain, or trialkylsilyl.

5. The semiconducting composition of claim 1, wherein the non-amorphous semiconductor material is a crystalline, semicrystalline, or liquid crystalline semiconductor.

6. The semiconducting composition of claim 1, wherein the molecular glass has a dielectric constant less than 4.0.

7. An electronic device comprising a semiconducting layer; wherein the semiconducting layer comprises a non-amorphous semiconductor material and a molecular glass; and wherein the molecular glass is selected from the group consisting of:

(A) a spiro compound of Formula (1) or Formula (2):

Formula (1)

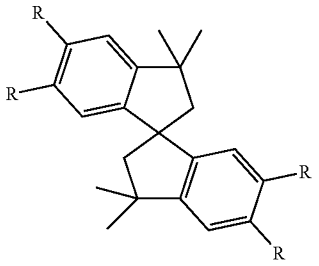

Formula (2)

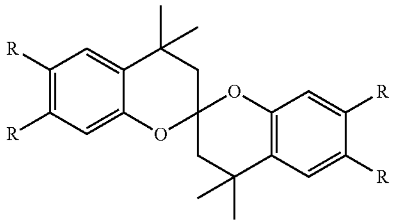

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy, and R' is alkyl;

(B) a structure selected from one of Formula (3) to Formula (8):

Formula (3)

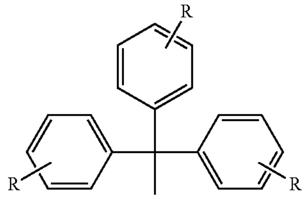

Formula (4)

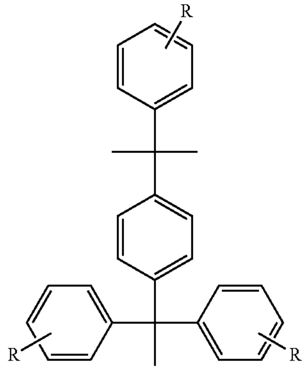

Formula (5)

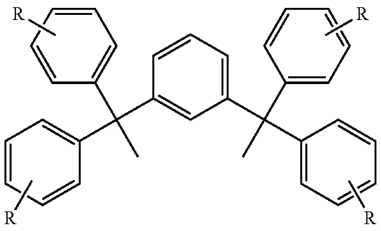

Formula (6)

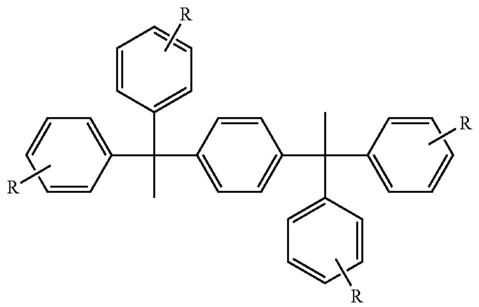

-continued

Formula (7)

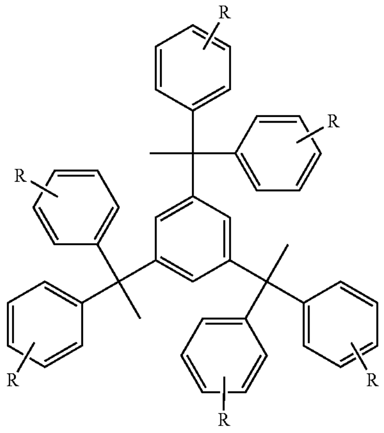

Formula (8)

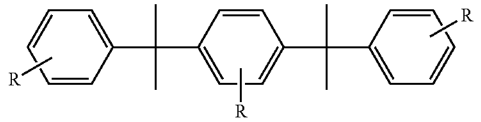

wherein each R is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy, and R' is alkyl;

(C) a silane of Formula (9):

Formula (9)

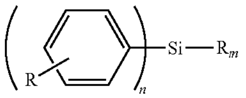

wherein each R is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COON, and, epoxy; R' is alkyl; and m and n are both integers, wherein m+n=4;

(D) an adamantane derivative of Formula (10):

Formula (10)

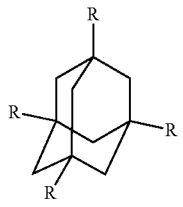

wherein each R is independently a substituent comprising a heteroatom;

(E) a structure selected from one of Formula (11) to Formula (13):

Formula (11)

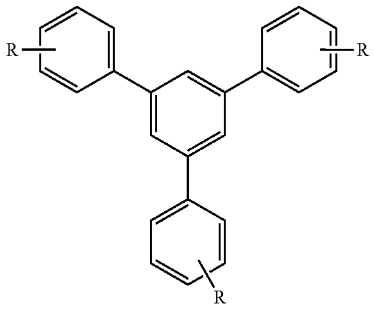

Formula (12)

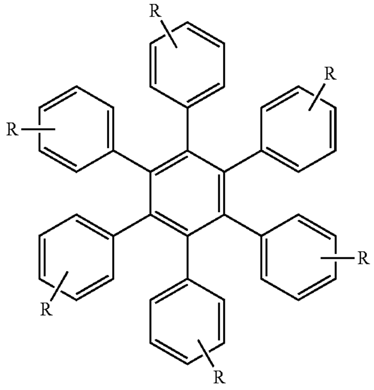

Formula (13)

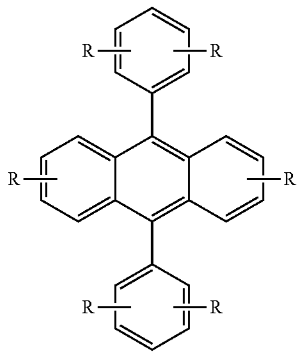

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; and R' is alkyl;

(F) a calixarene derivative of Formula (14):

Formula (14)

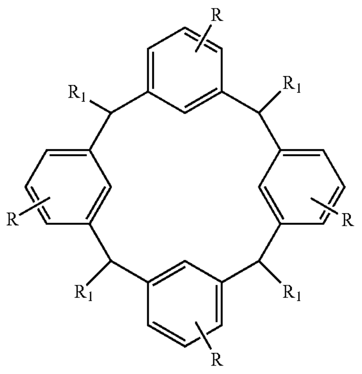

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH and epoxy; R' is alkly; and each $R_1$ is a phenyl group substituted with an oxygen-containing radical; and (G) an arylamine derivative selected from one of Formula (16)-(24):

Formula (16)

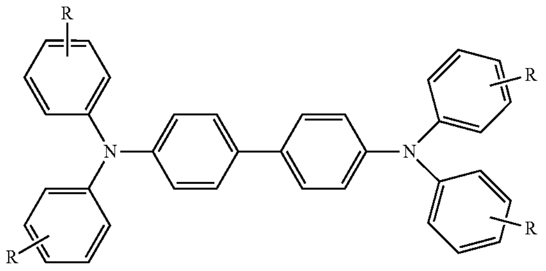

Formula (17)

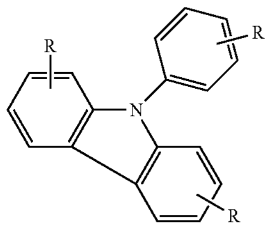

-continued
Formula (18)
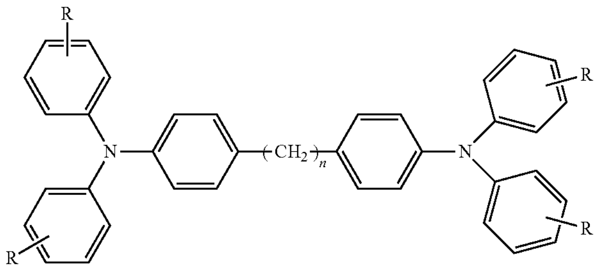
Formula (19)
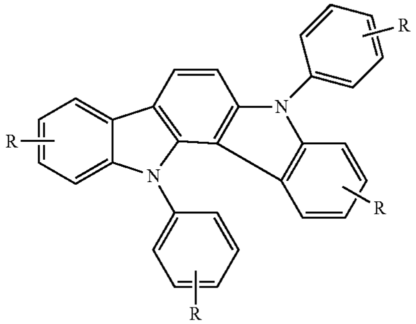
Formula (20)
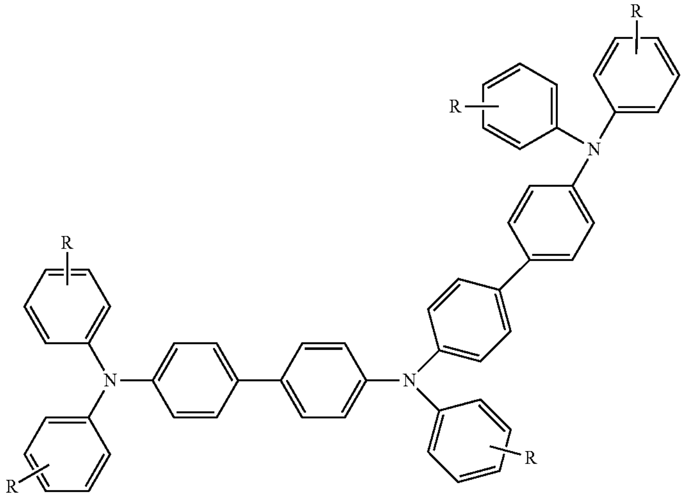
Formula (21)
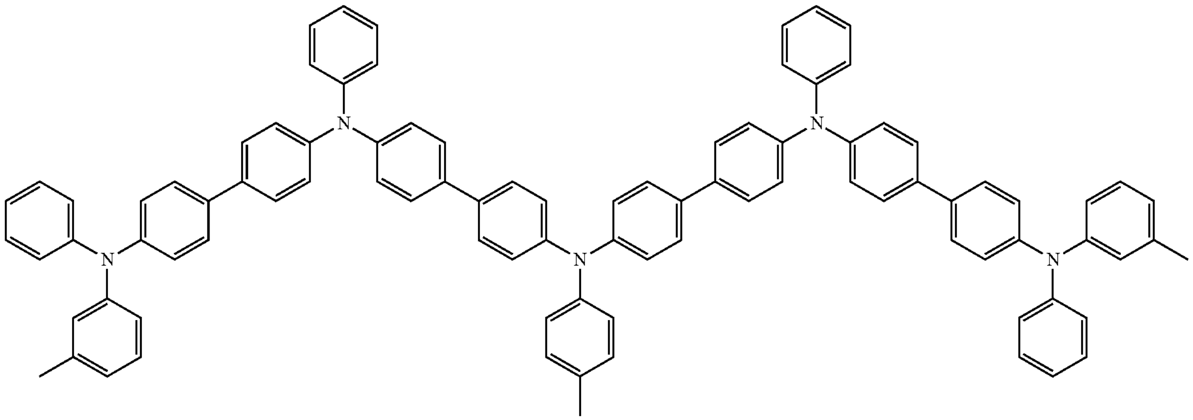

-continued

Formula (22)

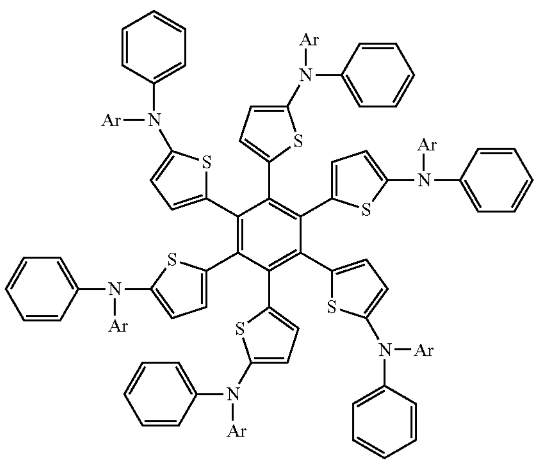

Formula (23)

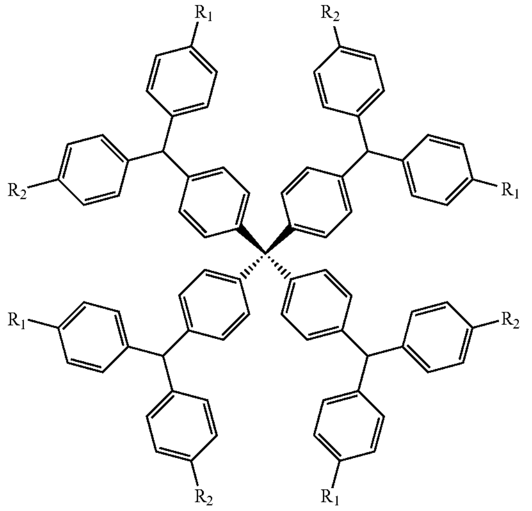

Formula (24)

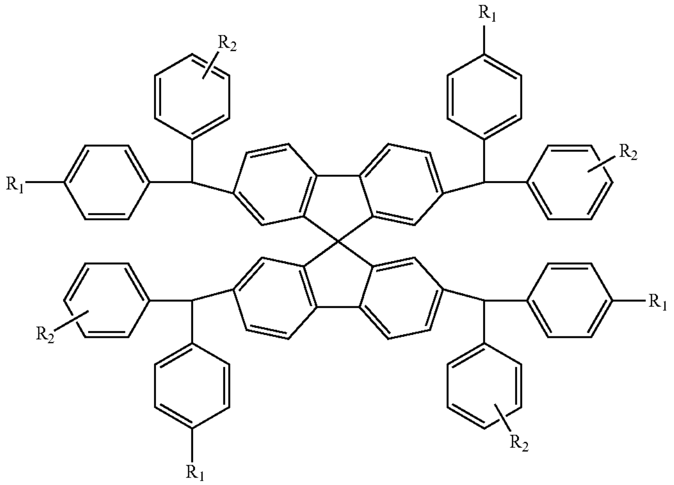

wherein each R, $R_1$, and $R_2$ substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy; R' is alkyl; n is an integer from 1 to 6; and Ar is independently selected from aryl, heteroaryl, substituted aryl, and substituted heteroaryl.

8. The electronic device of claim 7, wherein the electronic device is a thin-film transistor.

9. An electronic device comprising a semiconducting layer; wherein the semiconducting layer comprises a non-amorphous semiconductor material and a molecular glass; wherein the non-amorphous semiconductor material is represented by Formula (26a) or (26b):

Formula (26a)

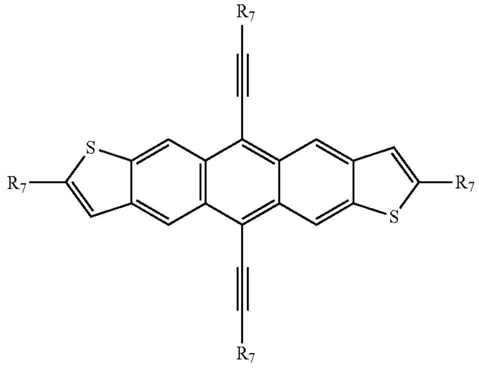

-continued

Formula (26b)

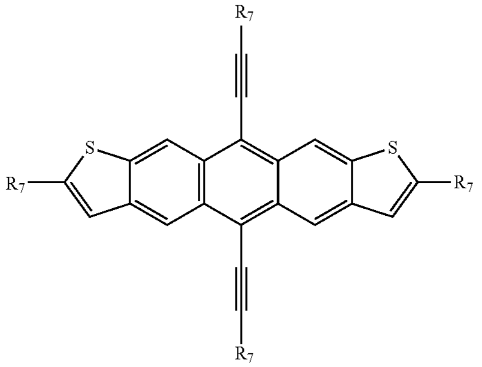

wherein $R_7$ is independently selected from the group consisting of hydrogen, halogen, alkyl, phenyl substituted with one alkyl chain, or trialkylsilyl; and wherein the molecular glass is represented by Formula (16):

Formula (16)

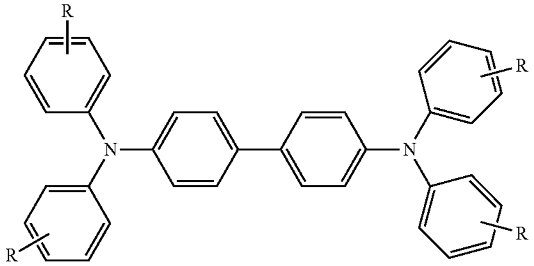

wherein each R substituent is independently selected from the group consisting of hydrogen, alkyl comprising from about 1 to about 18 carbon atoms, aryl or substituted aryl having from about 3 to about 18 carbon atoms, hydroxyl, protected hydroxyl, amino, protected amino, —OR', —OCOOR', —CNO, —NHCOOR', hydroxyphenyl, —COOH, and epoxy.

* * * * *